United States Patent
Yamaguchi et al.

(10) Patent No.: US 8,421,838 B2
(45) Date of Patent: Apr. 16, 2013

(54) OPTICAL DEVICE, OPTICAL SCANNING DEVICE, IMAGE FORMING APPARATUS, AND MANUFACTURING METHOD OF OPTICAL DEVICE

(75) Inventors: Takayuki Yamaguchi, Miyagi (JP); Satoru Sugawara, Miyagi (JP); Kazuhiko Adachi, Miyagi (JP); Masaki Hiroi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 141 days.

(21) Appl. No.: 12/944,003

(22) Filed: Nov. 11, 2010

(65) Prior Publication Data

US 2011/0109713 A1 May 12, 2011

(30) Foreign Application Priority Data

Nov. 12, 2009 (JP) ................................. 2009-258536
Jul. 28, 2010 (JP) ................................. 2010-168978

(51) Int. Cl.
*B41J 2/45* (2006.01)
*H01L 23/10* (2006.01)

(52) U.S. Cl.
USPC ......................................... 347/238; 257/710

(58) Field of Classification Search .................. 347/238, 347/242, 245, 257, 263; 257/704, 707, 710, 257/712
See application file for complete search history.

(56) References Cited

U.S. PATENT DOCUMENTS

| | | | |
|---|---|---|---|
| 5,357,123 A | 10/1994 | Sugawara | |
| 6,975,663 B2 | 12/2005 | Sekiya et al. | |
| 7,002,527 B2 | 2/2006 | Sugawara | |
| 7,078,804 B2 | 7/2006 | Hong et al. | |
| 8,073,028 B2* | 12/2011 | Yamaguchi | 372/34 |
| 2004/0018768 A1* | 1/2004 | Lee | 439/342 |
| 2009/0285252 A1 | 11/2009 | Ishii et al. | |
| 2009/0295902 A1 | 12/2009 | Sato et al. | |
| 2009/0296762 A1 | 12/2009 | Yamaguchi | |
| 2009/0310632 A1 | 12/2009 | Sugawara et al. | |

FOREIGN PATENT DOCUMENTS

| | | | |
|---|---|---|---|
| JP | 02040936 A | * | 2/1990 |
| JP | 2674214 | | 7/1997 |
| JP | 2001-267681 | | 9/2001 |
| JP | 2004-228549 | | 8/2004 |
| JP | 2005-329532 | | 12/2005 |
| JP | 2010-10660 | | 1/2010 |

\* cited by examiner

*Primary Examiner* — Hai C Pham
(74) *Attorney, Agent, or Firm* — Cooper & Dunham LLP

(57) ABSTRACT

An optical device including an optical element; a package member in which the optical element is held on a bottom surface of the package member in an area surrounded by walls; and a plate member that seals the area surrounded by the walls and the bottom surface in an airtight manner, the plate member being translucent and joined to the package member with a resin material. The walls have a structure including steps, the plate member is joined onto one of the steps of the walls, and at least a part of the walls facing side surfaces of the plate member includes a positioning part for positioning the plate member and a retaining part for retaining the resin material, in a direction perpendicular to the bottom surface.

10 Claims, 22 Drawing Sheets

FIG.3
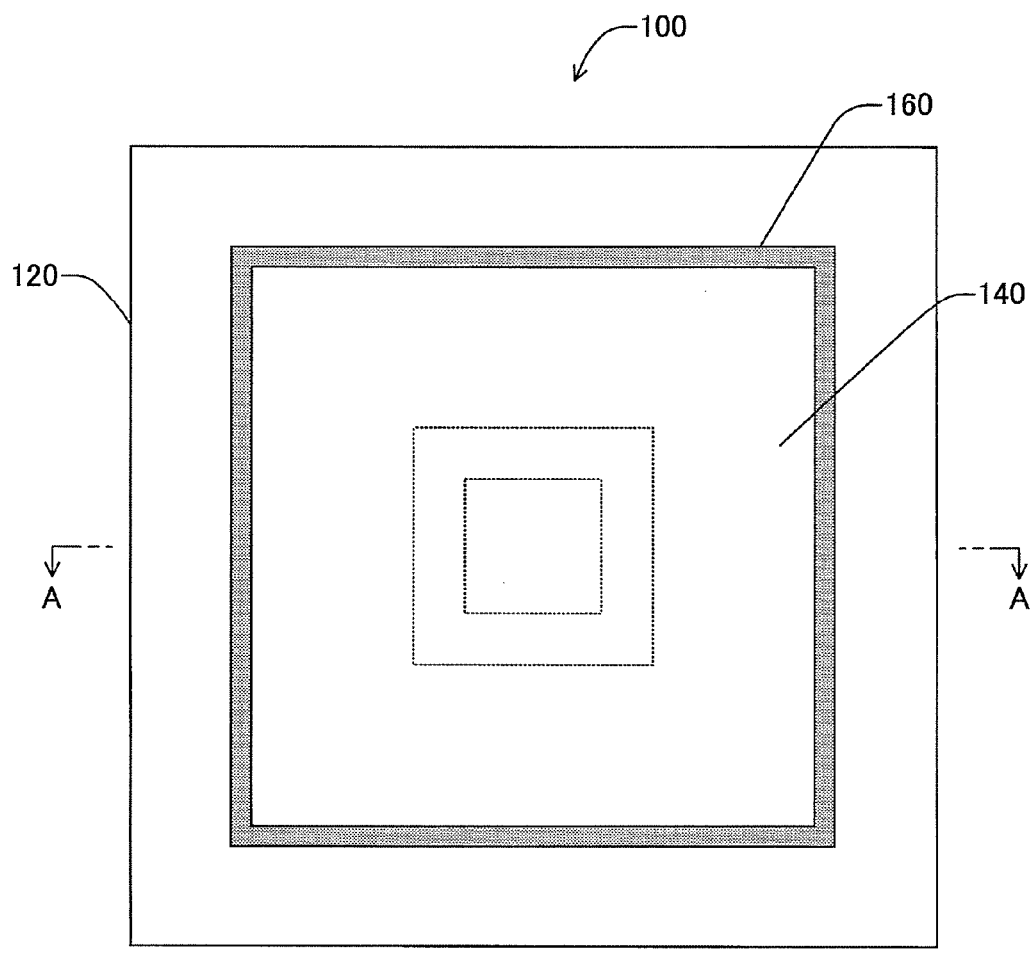
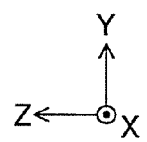

OPTICAL DEVICE, OPTICAL SCANNING DEVICE, IMAGE FORMING APPARATUS, AND MANUFACTURING METHOD OF OPTICAL DEVICE

BACKGROUND OF THE INVENTION

1. Field of the Invention

The present invention relates to optical devices, optical scanning devices, image forming apparatuses, and manufacturing methods of optical devices. More specifically, the present invention relates to an optical device in which an optical element is held by a package member, an optical scanning device including the optical device, an image forming apparatus including the optical scanning device, and a manufacturing method of the optical device.

2. Description of the Related Art

In recent years and continuing, optical elements have been practically applied and used in various types of optical equipment. Examples of optical elements are a light receiving element such as a CCD sensor and a CMOS sensor, a light emitting element such as a surface-emitting laser, an optical scanner element using an MEMS mirror, and an optical switching element.

For the purpose of improving efficiency, these optical elements are typically used in a two-dimensional array. When optical elements are used in a two-dimensional array, the number of signal lines increases. Hence, it is difficult to accommodate the optical elements in a typical CAN package, and therefore the optical elements are typically accommodated in a ceramic package.

The ceramic package accommodating the optical elements is sealed in an airtight manner with a translucent lid member made of a material such as glass or sapphire, to achieve environmental resistance.

Conventionally, the ceramic package and the lid member are joined together by a hermetic seal (see, for example, patent document 1), by soldering (see, for example, patent document 2), etc.

In recent years and continuing, for the purpose of reducing cost, resin (resin adhesive) is increasingly used for joining together the ceramic package and the lid member (see, for example, patent document 3).

Patent document 4 discloses a package in a semiconductor device formed as follows. Specifically, a recessed portion is formed on the top surface of the package body accommodating a semiconductor element. A cap is fit into the recessed portion, and sealing glass is applied around the cap to seal the package body in an airtight manner. In this package of a semiconductor device, the recessed portion has substantially the same size as the cap. Furthermore, the recessed portion has leading-in parts extending outwards, provided at plural positions along the periphery of the recessed portion.

In a conventional ceramic package, a recessed portion is provided on the surface of the ceramic package, so that the lid member can be adhered to an appropriate position. The size of the recessed portion is determined such that the gap between the recessed portion and the lid member is minimized.

When resin is used for joining together the ceramic package and the lid member, the resin has a tendency of protruding outside the ceramic package. Consequently, the appearance of the product may be degraded. Furthermore, the protruding resin may break off as a result of contacting other objects in the process of distributing or using the ceramic package. When the resin breaks off, the airtightness of the ceramic package may be degraded, depending on the extent of the resin that has broken off.

Furthermore, the protruding resin may be obstacles when assembling an optical system with lenses on the ceramic package.

The resin may be prevented from protruding outside by reducing the amount of resin used. However, it is difficult to control the amount of resin in the manufacturing process. If the amount of resin is too small, the ceramic package may not be appropriately sealed in an airtight manner. Furthermore, resin basically has a moisture-permeable feature, and thus lacks resistance to high temperature and high humidity. Therefore, it is necessary to increase the sealing width (area of adhering resin) for the purpose of enhancing the resistance to high temperature and high humidity. This makes it even more difficult to control the amount of resin.

One approach is to increase the size of the gap between the recessed portion and the lid member. However, this may degrade the precision in positioning the lid member.

The inventors of the present invention made a product with reference to the package in a semiconductor device disclosed in patent document 4. The inventors formed a recessed portion on the package having substantially the same size as the lid member, formed leading-in parts extending outwards provided at plural positions along the periphery of the recessed portion, and joined the lid member to the recessed portion with the use of resin. As a result, it was found that resin protruded outside at parts where there are no leading-in parts, and therefore, the quality of the product was not good.

Patent Document 1: Japanese Laid-Open Patent Application No. 2004-228549

Patent Document 2: Japanese Laid-Open Patent Application No. 2005-329532

Patent Document 3: Japanese Laid-Open Patent Application No. 2001-267681

Patent Document 4: Japanese Patent No. 2674214

SUMMARY OF THE INVENTION

The present invention provides an optical device, an optical scanning device, an image forming apparatus, and a manufacturing method of the optical device, in which one or more of the above-described disadvantages are eliminated.

A preferred embodiment of the present invention provides an optical device, an optical scanning device, an image forming apparatus, and a manufacturing method of the optical device, with which productivity can be increased without decreasing the resistance to high temperature and high humidity.

According to an aspect of the present invention, there is provided an optical device including an optical element; a package member in which the optical element is held on a bottom surface of the package member in an area surrounded by walls; and a plate member that seals the area surrounded by the walls and the bottom surface in an airtight manner, the plate member being translucent and joined to the package member with a resin material, wherein the walls have a structure including steps, the plate member is joined onto one of the steps of the walls, and at least a part of the walls facing side surfaces of the plate member includes a positioning part for positioning the plate member and a retaining part for retaining the resin material, in a direction perpendicular to the bottom surface.

According to one embodiment of the present invention, an optical device, an optical scanning device, an image forming apparatus, and a manufacturing method of the optical device are provided, which are capable of increasing productivity without decreasing the resistance to high temperature and high humidity.

BRIEF DESCRIPTION OF THE DRAWINGS

Other objects, features and advantages of the present invention will become more apparent from the following detailed description when read in conjunction with the accompanying drawings, in which:

FIG. 3 is for describing an optical device (part 1);

DETAILED DESCRIPTION OF THE PREFERRED EMBODIMENTS

A description is given, with reference to the accompanying drawings, of embodiments of the present invention.

Figure 1:
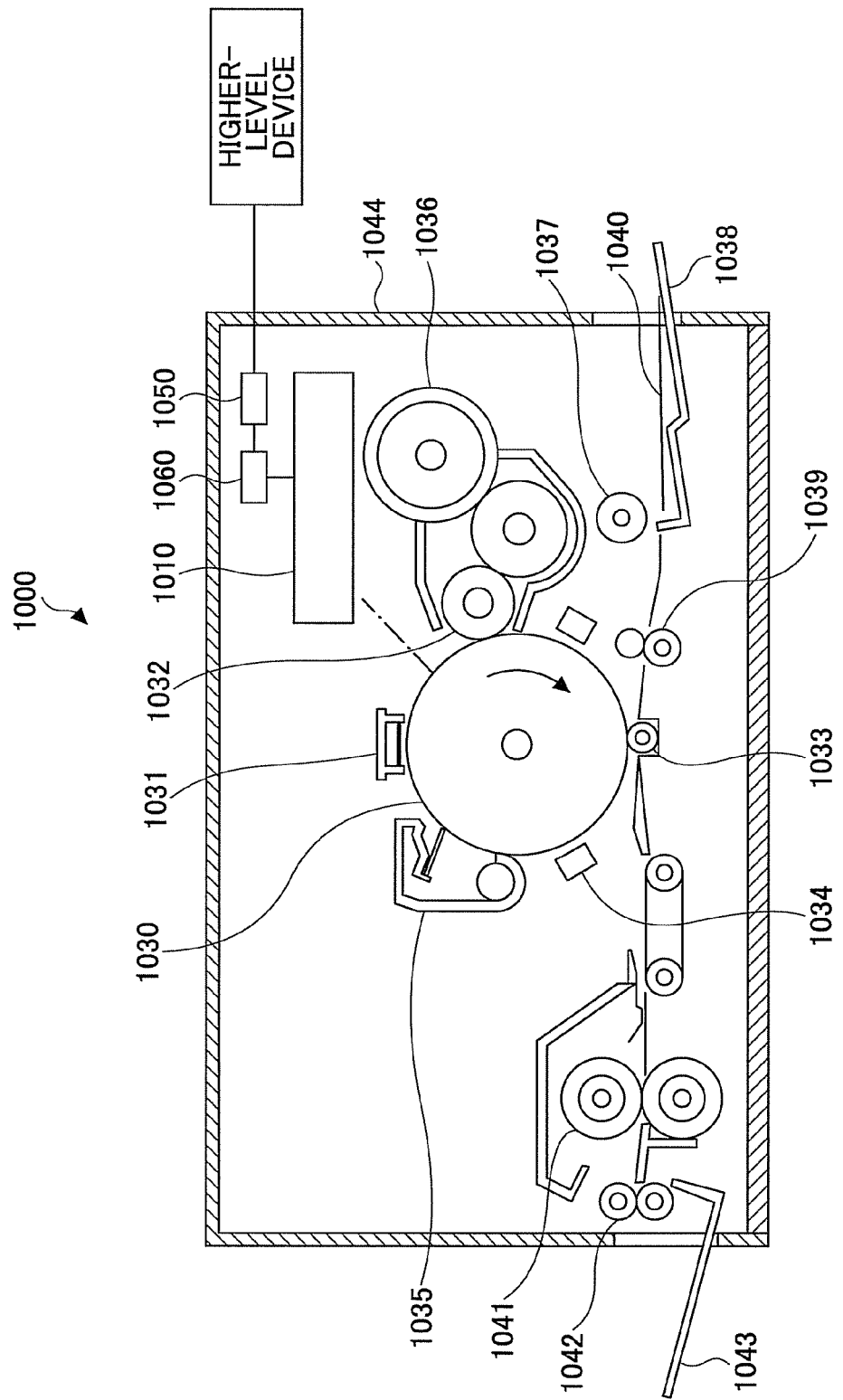
FIG. 1 is a schematic diagram of a laser printer according to an embodiment of the present invention.

FIG. 1 is a schematic diagram of a laser printer 1000 according to an embodiment of the present invention.

The laser printer 1000 includes an optical scanning device 1010, a photoconductive drum 1030, a charging unit 1031, a developing roller 1032, a transfer charger 1033, a discharging unit 1034, a cleaning unit 1035, a toner cartridge 1036, a sheet feeding roller 1037, a sheet feeding tray 1038, a pair of resist rollers 1039, a fixing roller 1041, a sheet eject roller 1042, a sheet eject tray 1043, a communications control device 1050, and a printer control device 1060 that is an integrated controller of the above elements. These elements are accommodated at predetermined positions in a printer housing 1044.

The communications control device 1050 controls bidirectional communications between the laser printer 1000 and a higher-level device (for example, a personal computer) via a network.

The photoconductive drum 1030 is a cylindrical member having a photoconductive layer formed on its surface. That is to say, the surface of the photoconductive drum 1030 is the target of scanning operations. Furthermore, the photoconductive drum 1030 is configured to rotate in a direction indicated by an arrow in FIG. 1.

The charging unit 1031, the developing roller 1032, the transfer charger 1033, the discharging unit 1034, and the cleaning unit 1035 are located near the surface of the photoconductive drum 1030. Specifically, these elements are positioned in the order of the charging unit 1031→the developing roller 1032→the transfer charger 1033→the discharging unit 1034→the cleaning unit 1035, along the rotation direction of the photoconductive drum 1030.

The charging unit 1031 uniformly charges the surface of the photoconductive drum 1030.

The optical scanning device 1010 scans the surface of the photoconductive drum 1030 that has been charged by the charging unit 1031, with light beams modulated based on image information received from the higher-level device. Accordingly, a latent image corresponding to the image information is formed on the surface of the photoconductive drum 1030. The formed latent image moves toward the developing roller 1032 in accordance with the rotation of the photoconductive drum 1030. The configuration of the optical scanning device 1010 is described below.

The toner cartridge 1036 stores toner, and the toner is supplied to the developing roller 1032.

The developing roller 1032 develops an image corresponding to the image information, by causing the toner supplied from the toner cartridge 1036 to adhere to the latent image formed on the surface of the photoconductive drum 1030. The latent image on which toner has adhered (hereinafter, also referred to as "toner image") moves toward the transfer charger 1033 in accordance with the rotation of the photoconductive drum 1030.

The sheet feeding tray 1038 accommodates recording sheets 1040. The sheet feeding roller 1037 is located near the sheet feeding tray 1038. The sheet feeding roller 1037 retrieves one recording sheet 1040 at a time from the sheet feeding tray 1038, and conveys the retrieved recording sheet 1040 to the pair of resist rollers 1039. The pair of resist rollers 1039 temporarily holds the recording sheet 1040 retrieved by the sheet feeding roller 1037, and then sends out the recording sheet 1040 into a gap between the photoconductive drum 1030 and the transfer charger 1033 in synchronization with the rotation of the photoconductive drum 1030.

A voltage of an opposite polarity to that of toner is applied to the transfer charger 1033, so that the toner on the surface of the photoconductive drum 1030 is electrically attracted to the recording sheet 1040. Due to this voltage, the toner image on the surface of the photoconductive drum 1030 is transferred to the recording sheet 1040. The recording sheet 1040 on which the toner image has been transferred is then sent to the fixing roller 1041.

At the fixing roller 1041, heat and pressure are applied to the recording sheet 1040, so that the toner is fixed onto the recording sheet 1040. The recording sheet 1040 onto which the toner has been fixed is then sent to the sheet eject tray 1043 via the sheet eject roller 1042. The recording sheets 1040 are sequentially stacked on the sheet eject tray 1043.

The discharging unit 1034 discharges the surface of the photoconductive drum 1030.

The cleaning unit 1035 removes the toner (residual toner) remaining on the surface of the photoconductive drum 1030. The part of the surface of the photoconductive drum 1030, from which the residual toner has been removed, returns to the position facing the charging unit 1031.

Next, a description is given of the optical scanning device 1010.

Figure 2:
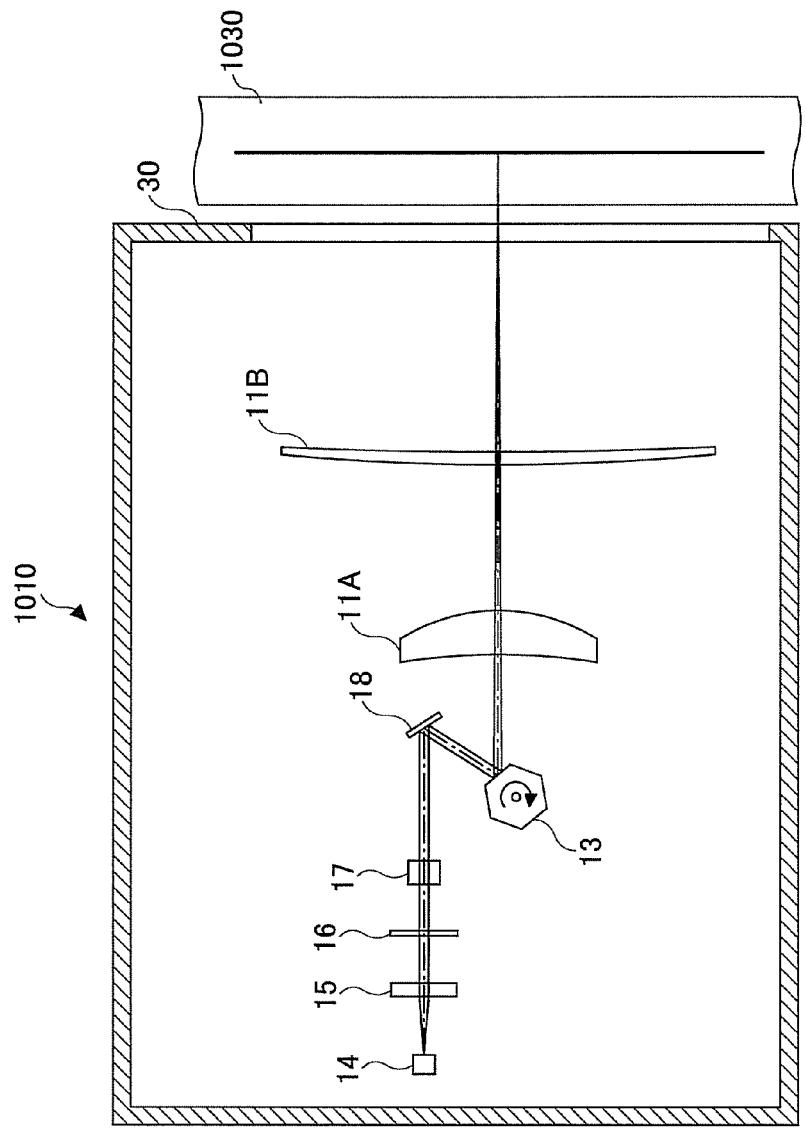
FIG. 2 is a schematic diagram of an optical scanning device shown in FIG. 1.

As shown in the example of FIG. 2, the optical scanning device 1010 includes a deflector side scanning lens 11A, an image face side scanning lens 11B, a polygon mirror 13, a light source 14, a coupling lens 15, an opening plate 16, a cylindrical lens 17, a reflection mirror 18, and a scan control device (not shown). These elements are situated at predetermined positions in an optical housing 30.

In the description of the present application, the direction extending along the longitudinal direction of the photoconductive drum 1030 is a Y axis direction, and the direction extending along the optical axis of the scanning lenses 11A and 11B is an X direction, in an XYZ three-dimensional orthogonal coordinate system.

Figure 4:
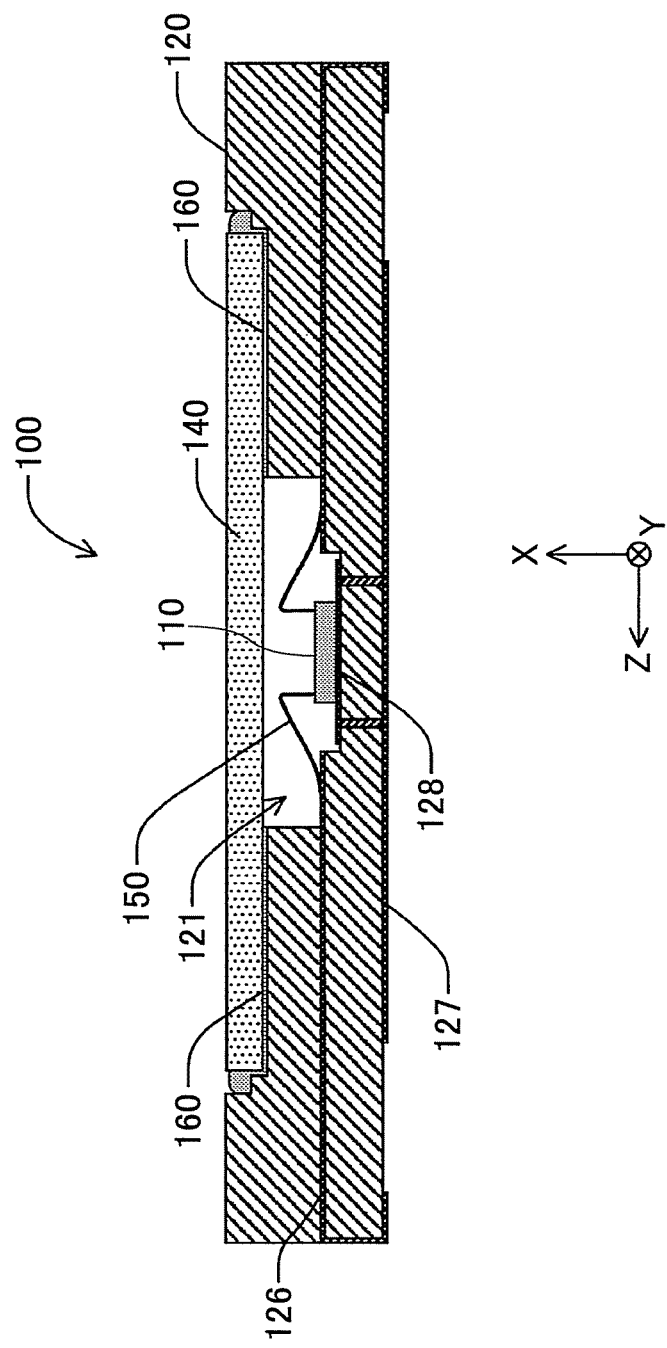
FIG. 4 is a cross-sectional view cut along a line A-A of FIG. 3.
Figure 5:
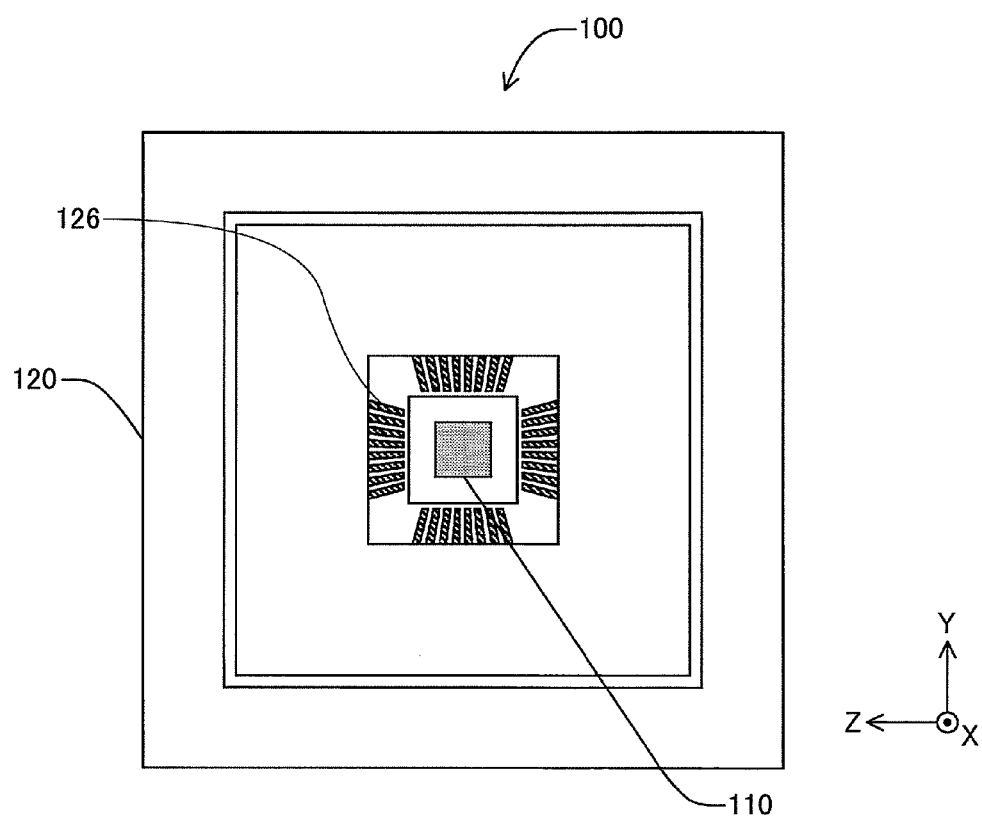
FIG. 5 is for describing an optical device (part 2)

The light source 14 includes an optical device 100 that is shown in FIGS. 3 through 5. FIG. 3 is a plan view of the optical device 100, and FIG. 4 is a cross-sectional view cut along a line A-A of FIG. 3. FIG. 5 illustrates the optical device 100 when a cover glass 140 in FIG. 3 is removed.

The optical device 100 includes a laser chip 110, a package member 120 for holding the laser chip 110, and the cover glass 140.

Figure 6:
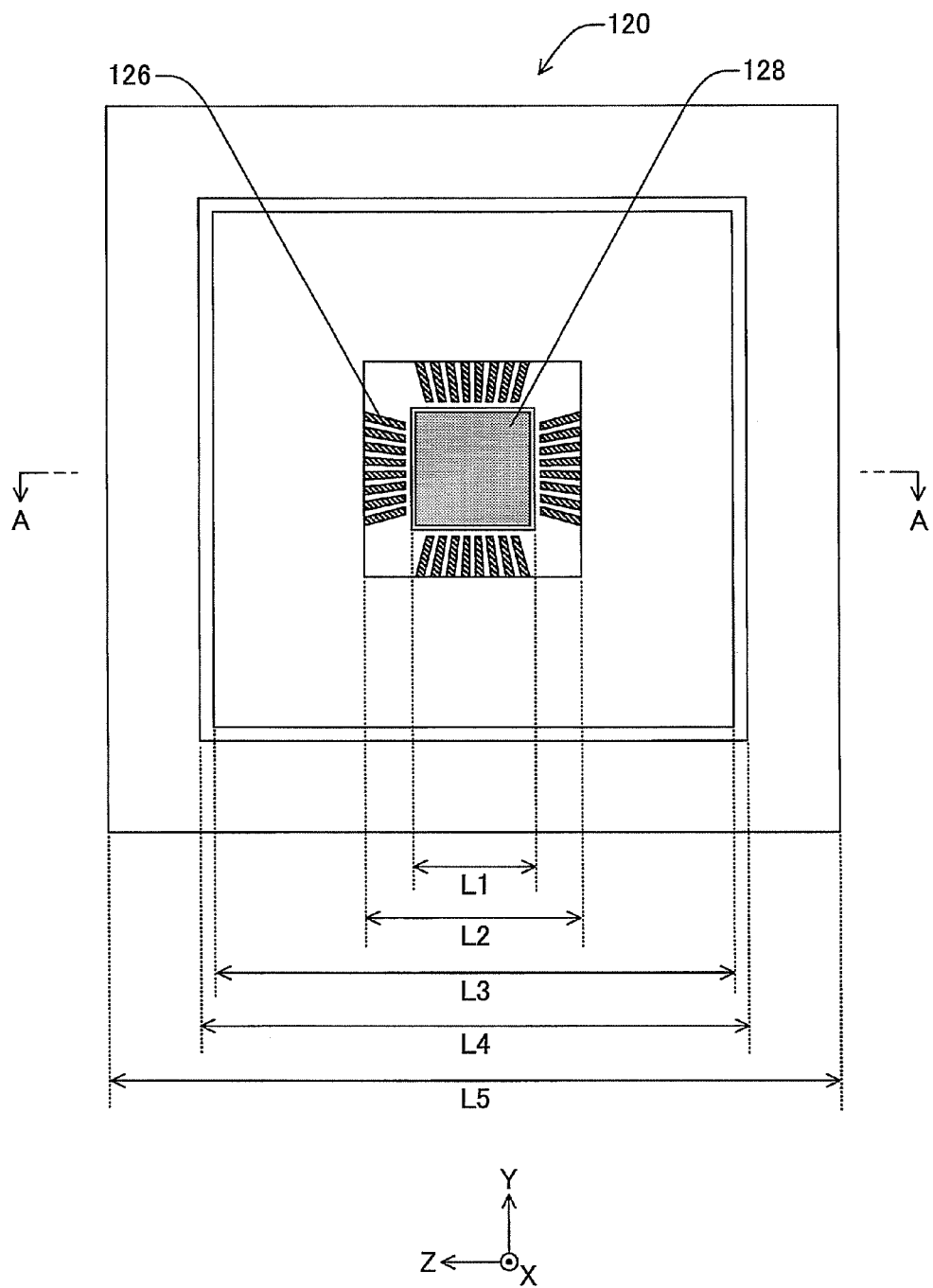
FIG. 6 is for describing a package member (part 1)
Figure 7:
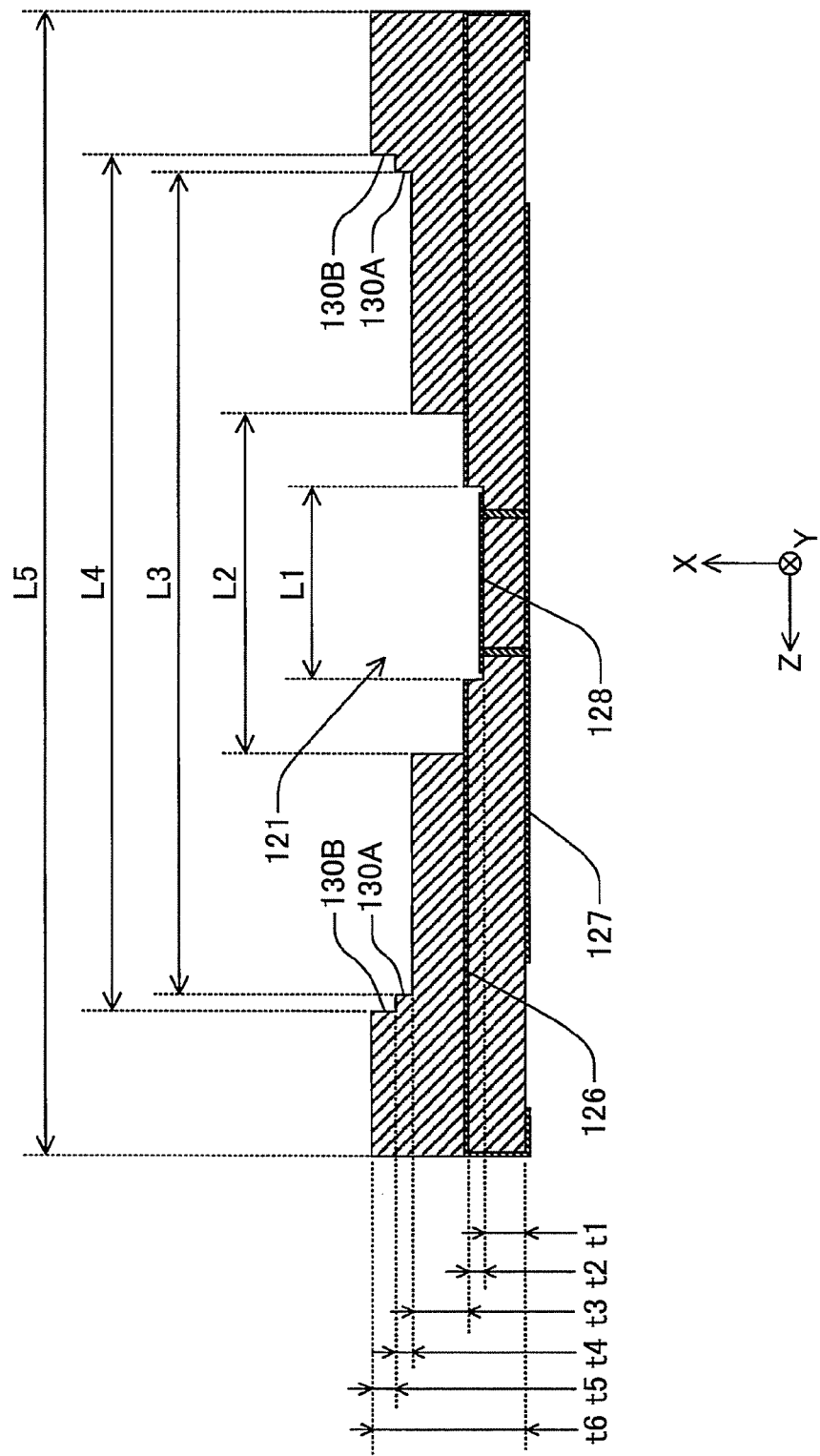
FIG. 7 is a cross-sectional view cut along a line A-A of FIG. 6.

The package member 120 is made of ceramics. On the +X side of the package member 120, there is a space area 121 that is surrounded by walls, as shown in FIGS. 6 and 7. In the example shown in FIGS. 6 and 7, L1 is 2.4 mm, L2 is 4.2 mm, L3 is 10.0 mm, L4 is 10.7 mm, and L5 is 14.2 mm. Furthermore, in FIG. 7, t1 is 0.5 mm, t2 is 0.2 mm, t3 is 0.7 mm, t4 is 0.18 mm, t5 is 0.3 mm, and t6 is 1.88 mm. FIG. 7 is a vertical sectional view of the package member 120.

A metal plate 128 is provided at the bottom surface of the space area 121. The metal plate 128 is electrically connected to a package electrode 127 provided on the surface of the package member 120 on the −X side.

Figure 8:
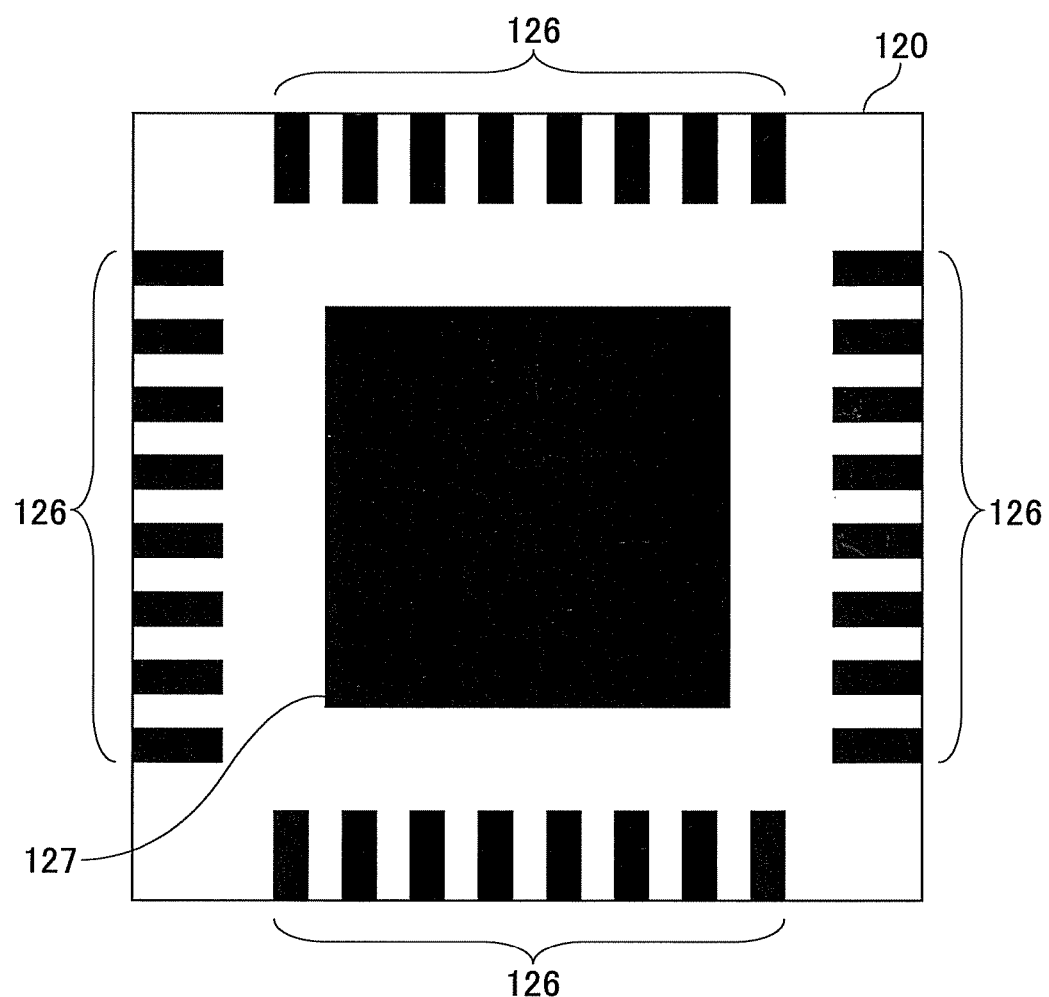
FIG. 8 is for describing a package member (part 2)

For example, the walls of the space area 121 have a three step structure. Plural package electrodes 126 (in this example, 32 package electrodes) are provided at the step on the −X side (first step). The package electrodes 126 extend along the side surface of the package member 120 and are exposed at the bottom surface of the package member 120 on the −X side. As shown in FIG. 8, on the −X side of the package member 120, the package electrode 127 is positioned in the center part, and plural package electrodes 126 are positioned along the peripheral part.

Figure 9:
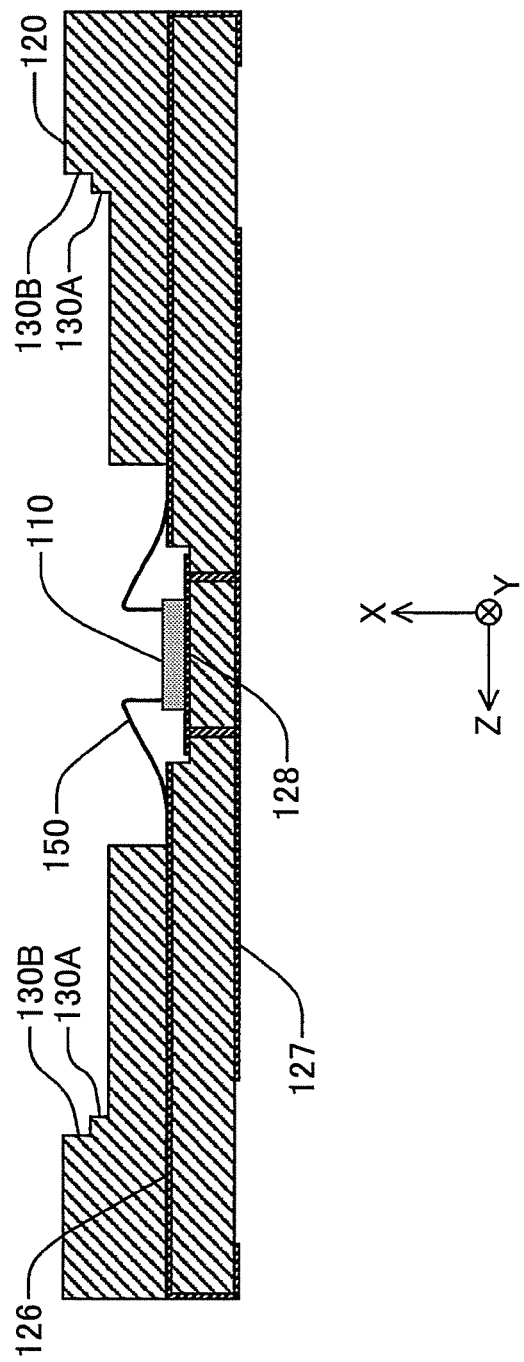
FIG. 9 is for describing a laser chip that is held in the package member.

As shown in FIG. 9, the laser chip 110 is positioned substantially at the center of the bottom surface of the space area 121, and is held on the metal plate 128. That is to say, the metal plate 128 is held on the bottom surface of the area that is surrounded by walls.

Figure 10:
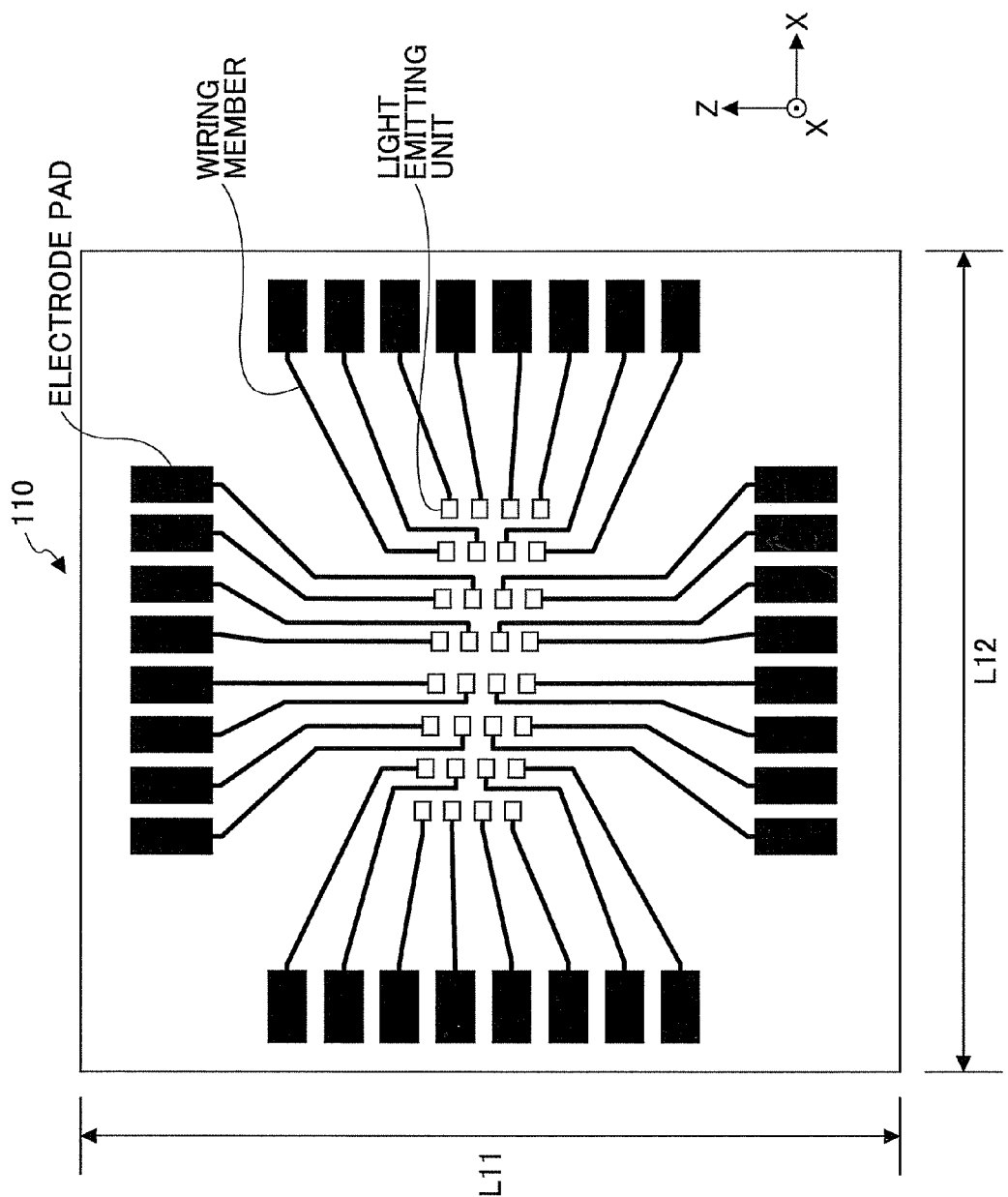
FIG. 10 is for describing the laser chip.

As shown in the example of FIG. 10, the laser chip 110 includes 32 light emitting units arranged two-dimensionally, and 32 electrode pads, which correspond to the 32 light emitting units and which are arranged around the 32 light emitting units. The electrode pads are electrically connected to corresponding light emitting units by wiring members. In FIG. 10, L11 is 1.2 mm and L12 is 1.2 mm. The thickness of the laser chip 110 is 0.3 mm. The electrode pads are electrically connected to corresponding package electrodes 126 by bonding wire 150.

Figure 11:
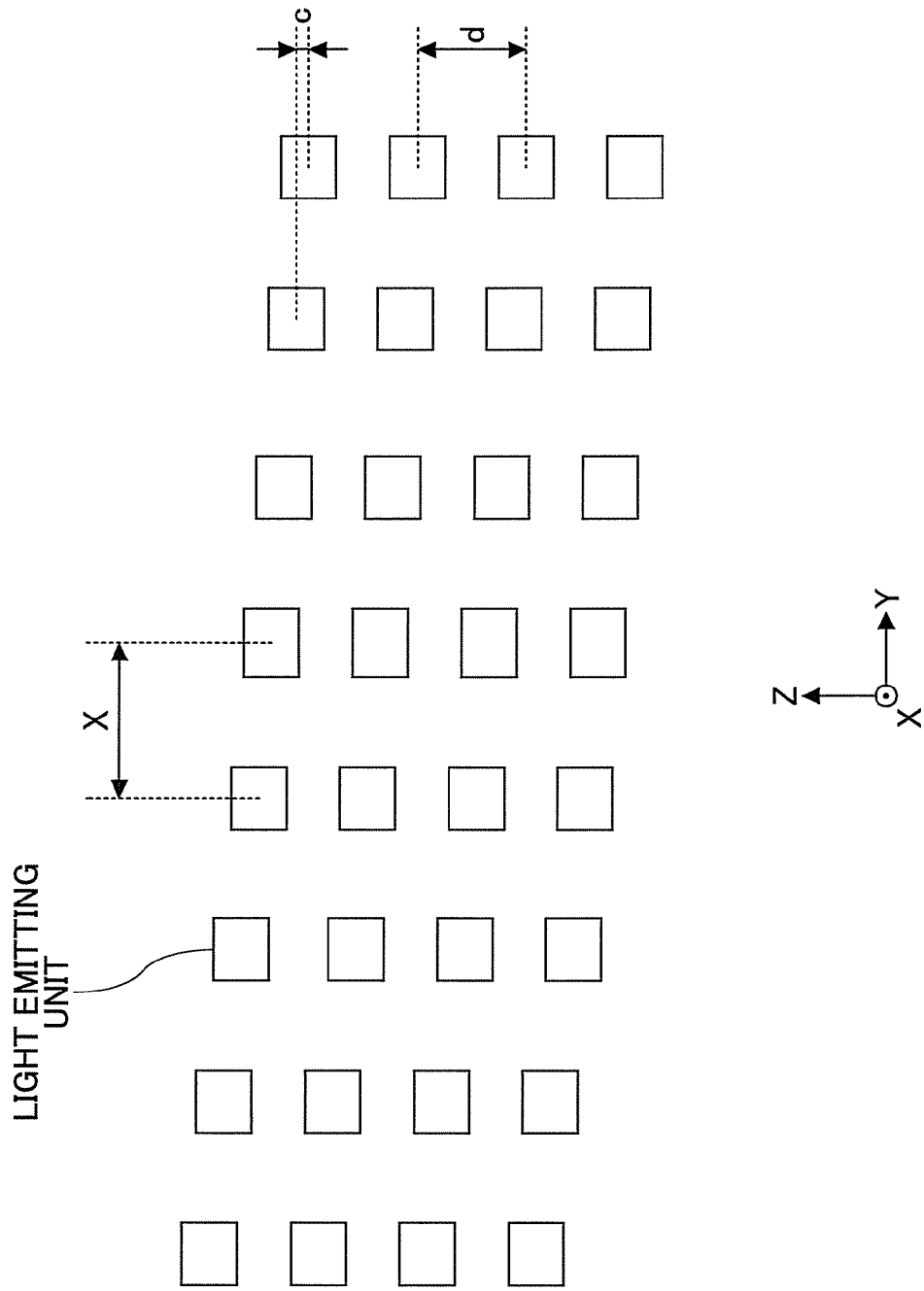
FIG. 11 is for describing plural light emitting units that are arranged in the laser chip.

As shown in FIG. 11, the 32 light emitting units are arranged such that they are equidistantly spaced apart (at light emitting unit intervals "c" in FIG. 11) when all light emitting units are orthographically-projected on virtual lines extending in the Z axis direction. In the present application, a "light emitting unit interval" means the center-to-center distance between two light emitting units. In this example, the light emitting unit interval is c=2.65 µm. The light emitting unit interval in the Y axis direction ("X" in FIG. 11) is 30 µm, and the light emitting unit interval in the Z axis direction ("d" in FIG. 11) is 18.4 µm.

In this example, each light emitting unit is a Vertical Cavity Surface-Emitting Laser (VCSEL) having an oscillation wavelength band of 780 nm. That is to say, the laser chip 110 is a so-called surface-emitting laser array. Furthermore, the n-side electrode of the laser chip 110 is joined to the metal plate 128 of the package member 120 by an adhesive having conductivity, so that the laser light emitting side is parallel to the Y-Z plane.

Figure 12:
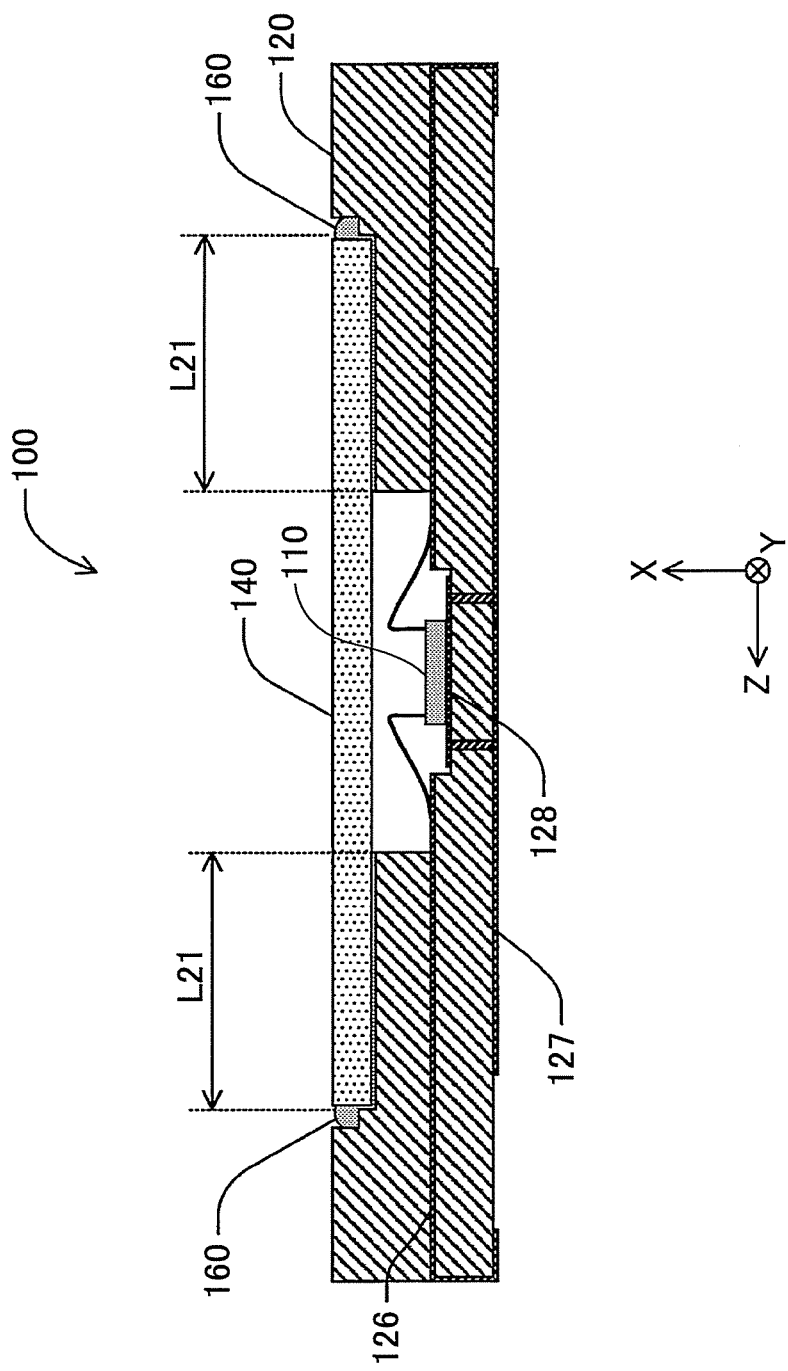
FIG. 12 is for describing a state where a cover glass is attached to the package member.

The cover glass 140 is a plate member having a square shape with sides of 9.7 mm and a thickness of 0.5 mm. As shown in FIG. 12, the cover glass 140 is joined onto the second step of walls of the space area 121 by an epoxy resin adhesive 160 (hereinafter, simply referred to as "resin"), in such a manner as to seal the space area 121 in an airtight manner. Accordingly, the laser chip 110 is protected.

There are two typical methods of joining a cover glass to a package member. The first method is (a) applying thermosetting resin to the package member, adhering the cover glass to the package member, and then heating the resin. The second method is (b) applying ultraviolet curable resin to the package member, adhering the cover glass to the package member, and then radiating ultraviolet rays onto the resin. However, with these methods, volatile components are generated when the resin is cured, and these volatile components adhere to the cover glass. Consequently, the light permeability of the cover glass may be degraded.

Therefore, in an embodiment of the present invention, a predetermined amount of thermosetting resin is applied to a predetermined area of the cover glass 140 in advance by screen printing or by using a dispenser. The resin applied on the cover glass 140 is turned into a B stage (i.e., in an intermediate stage in the reaction of thermosetting resin, where there is no tackiness and the resin appears to be half-cured). Then, the cover glass 140 is pressed against the package member 120, such that the side of the cover glass 140 with the B stage thermosetting resin contacts the package member 120. Then, the thermosetting resin is heated at high temperature, so that the thermosetting resin is remelted. In this case, volatile components have been generated and removed in the process of turning the thermosetting resin into the B stage. Therefore, when the thermosetting resin is remelted, substantially no volatile components are generated. Accordingly, it is possible to prevent the light permeability of the cover glass 140 from being degraded.

In this example, the sealing width L21 is 2.9 mm, which is sufficient for attaining resistance to high temperature and high humidity.

Figure 13:
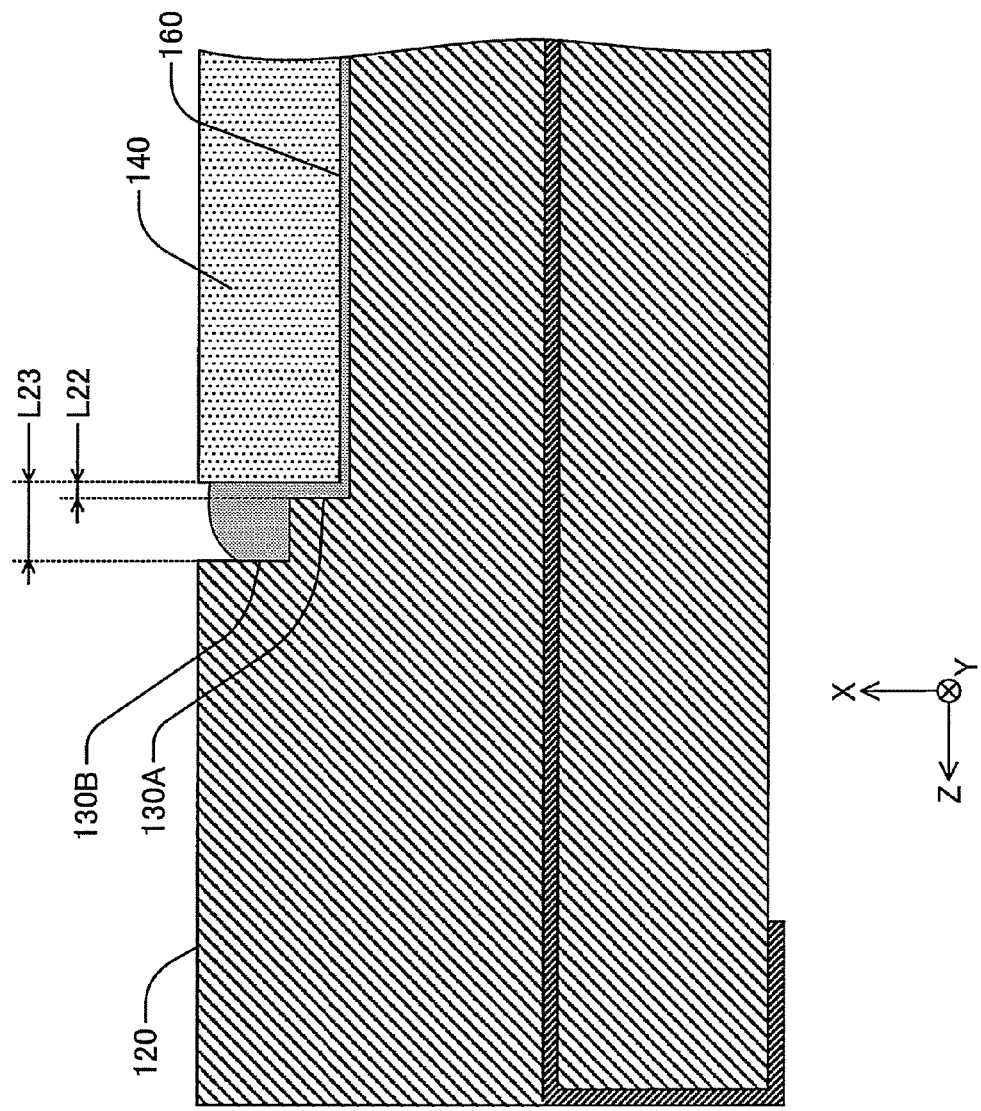
FIG. 13 is a partial enlarged view of FIG. 12.

FIG. 13 shows an enlarged view of a part of FIG. 12. As shown in FIG. 13, the side surface of the cover glass 140 faces a wall 130A and a wall 130B in the Z axis direction. An interval L22 between the side surface of the cover glass 140 and the wall 130A is 0.15 mm. Therefore, the cover glass 140 can be easily attached to the package member 120 with high precision. Furthermore, an interval L23 between the side surface of the cover glass 140 and the wall 130B is 0.50 mm. The resin is retained in the gap between the side surface of the cover glass 140 and the wall 130B, so that the resin is prevented from protruding out from the surface of the cover glass 140 on the +X side.

That is to say, the package member 120 has a positioning part where the cover glass 140 is positioned as well as a resin retaining part, in a direction perpendicular to the bottom surface of the space area 121.

Therefore, with the optical device 100, it is possible to increase productivity without decreasing the resistance to high temperature and high humidity.

The optical device 100 is mounted on a circuit board (not shown) together with a light source control device (not shown) for supplying a driving current to the laser chip 110.

The light source 14 is attached to the optical housing 30 in such a manner as to rotate around an axis parallel to the X axis direction. Accordingly, the pitch of the light beams focused on the surface of the photoconductive drum 1030 in the sub scanning direction is adjusted to be a predetermined pitch.

Referring back to FIG. 2, the coupling lens 15 turns the light beams output from the light source 14 into substantially parallel light beams.

The opening plate 16 has an opening, and adjusts the light beams received via the coupling lens 15.

The cylindrical lens 17 focuses the light beams that have passed though the opening of the opening plate 16, near the deflective reflection surface of the polygon mirror 13 via the reflection mirror 18, in the Z axis direction.

The optical system positioned along the light path between the light source 14 and the polygon mirror 13 is also referred to as a pre-deflector optical system. In the present embodiment, the pre-deflector optical system includes the coupling lens 15, the opening plate 16, the cylindrical lens 17, and the reflection mirror 18.

For example, the polygon mirror 13 includes a hexagonal polygon mirror with six mirror surfaces, whose inscribed circle has a radius of 18 mm. The six mirror surfaces correspond to deflective reflection surfaces. The polygon mirror 13 rotates at a constant speed around an axis parallel to the Z axis direction, and deflects the light beams from the reflection mirror 18.

The deflector side scanning lens 11A is arranged on a light path of light beams deflected by the polygon mirror 13.

The image face side scanning lens 11B is arranged on a light path of light beams that have passed through the deflector side scanning lens 11A. The light beams that have passed through the image face side scanning lens 11B are radiated onto the surface of the photoconductive drum 1030, and a light spot is formed on the surface of the photoconductive drum 1030. The light spot moves in the longitudinal direction of the photoconductive drum 1030 as the polygon mirror 13 rotates. That is to say, the light spot scans the surface of the photoconductive drum 1030. The direction in which the light spot moves in this operation is referred to as the "main scanning direction". The direction in which the photoconductive drum 1030 rotates in this operation is referred to as the "sub scanning direction".

The optical system that is arranged on the light path between the polygon mirror 13 and the photoconductive drum 1030 is also referred to as a scanning optical system. In the present embodiment, the scanning optical system includes the deflector side scanning lens 11A and the image face side scanning lens 11B. At least one turn-back mirror may be arranged on at least one of the light paths extending between the deflector side scanning lens 11A and the image face side scanning lens 11B, and the light path extending between the image face side scanning lens 11B and the photoconductive drum 1030.

As described above, the optical device 100 according to the present embodiment includes the laser chip 110, the package member 120 that holds the laser chip 110 on the bottom surface of the space area 121 that is surrounded by walls, and the cover glass 140 that is joined to a step in the walls of the space area 121 and that seals the space area 121 in an airtight manner.

The surfaces of the walls of the package member 120 that face the side surfaces of the cover glass 140 have protruding parts and receding parts, in a vertical sectional view. The protruding parts are used for positioning the cover glass 140, while the receding parts are used for retaining the resin. Therefore, it is possible to increase the productivity without decreasing the resistance to high temperature and high humidity.

In the optical scanning device 1010 according to the present embodiment, the light source 14 includes the optical device 100, and therefore optical scanning can be performed in a stable manner.

Furthermore, the light source 14 includes plural light emitting units, and therefore plural optical scanning operations can be performed simultaneously, so that images can be formed with increased speed.

In the laser chip 110, the light emitting units are arranged such that they are equidistantly spaced apart when all light emitting units are orthographically-projected on a virtual line extending in the Z axis direction. Therefore, by adjusting the timings of lighting the light emitting units, the light beams radiated on the photoconductive drum 1030 may be the same as those of a case where light sources are equidistantly spaced apart in the sub scanning direction.

For example, assuming that the magnification ratio of the optical system is two, writing dots can be formed on the photoconductive drum 1030 at intervals of 5.3 μm in the sub scanning direction. This corresponds to 4800 dpi (dots per inch). That is to say, the dots can be written at a high density of 4800 dpi. The density can be increased even more by increasing the number of surface-emitting lasers in the main scanning direction, or by forming an array in which the light emitting unit intervals "c" are even more reduced by reducing the pitch "d", or by decreasing the magnification ratio of the optical system. By increasing the density, the printing quality can be increased. The writing intervals in the main scanning direction can be easily controlled by adjusting the timings of lighting the light source.

In the laser printer 1000, even if the density of the written dots is increased, printing operations can be performed without reducing the printing speed. Furthermore, if the density of the written dots is the same as that of a conventional printer, the laser printer 1000 can perform printing operations at higher speed than that of a conventional printer.

The laser printer 1000 according to the present embodiment includes the optical scanning device 1010, and can thus form high quality images.

Furthermore, the light source 14 includes plural light emitting units, and therefore high density images can be formed.

Figure 14:
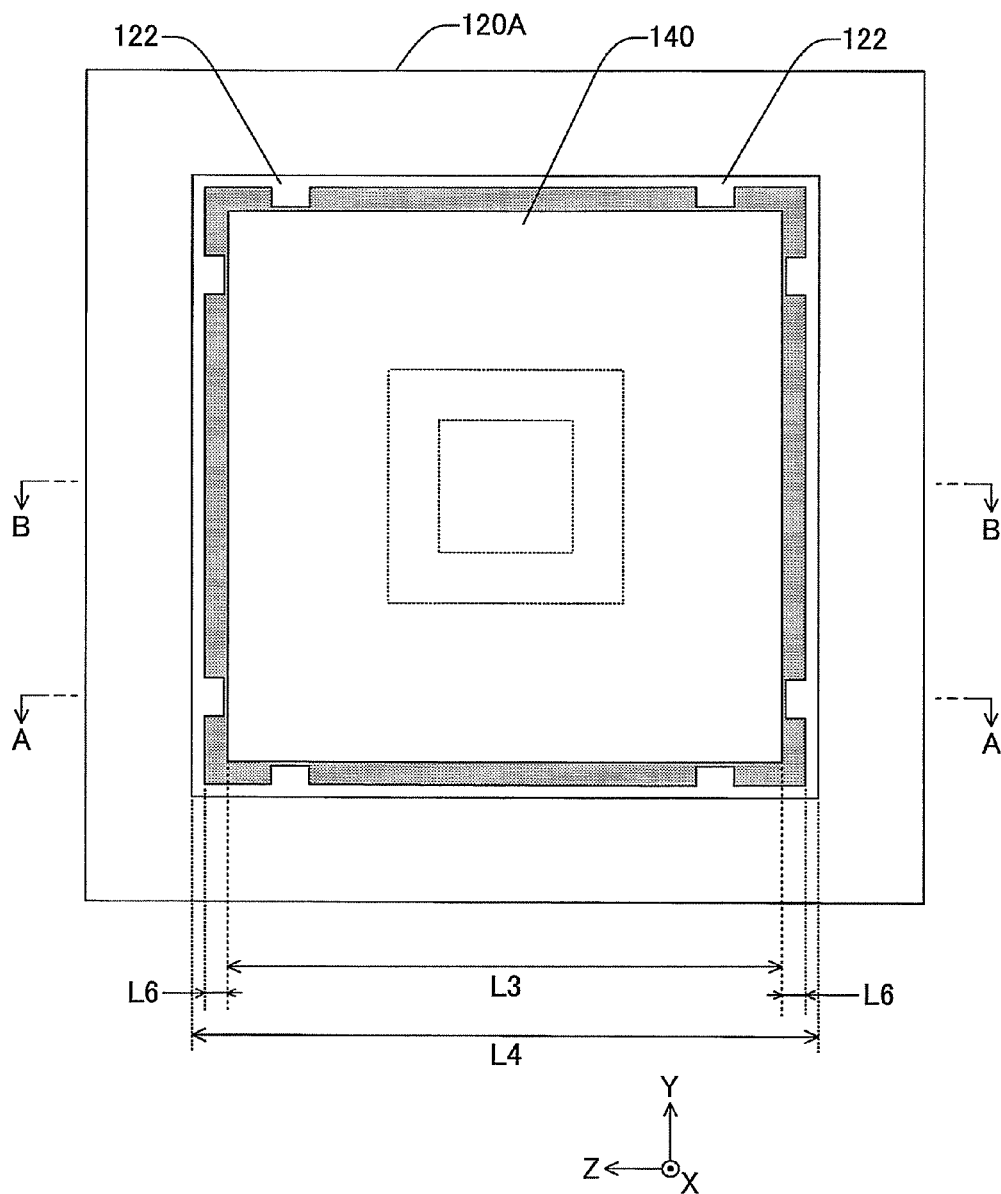
FIG. 14 is for describing a first modification of the package member.
Figure 15:
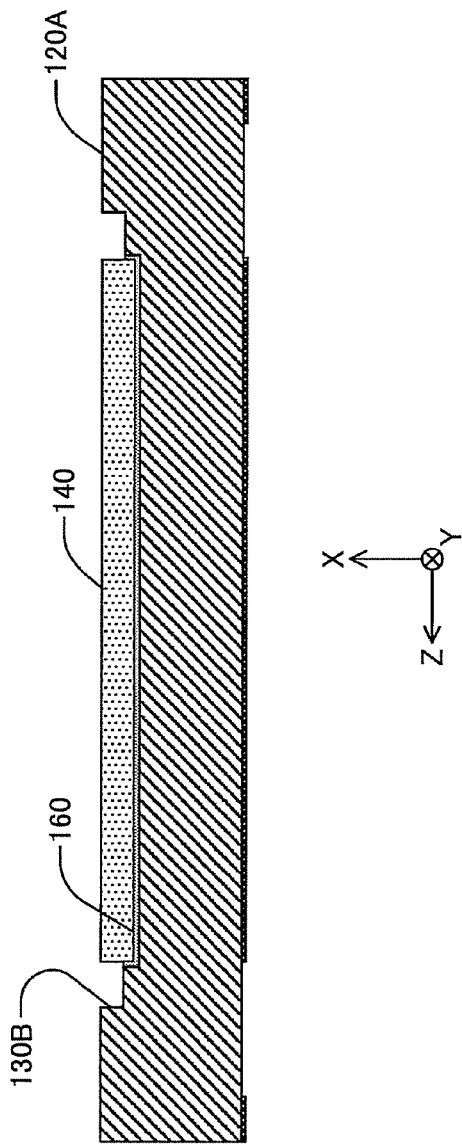
FIG. 15 is a cross-sectional view cut along a line A-A of FIG. 14.
Figure 16:
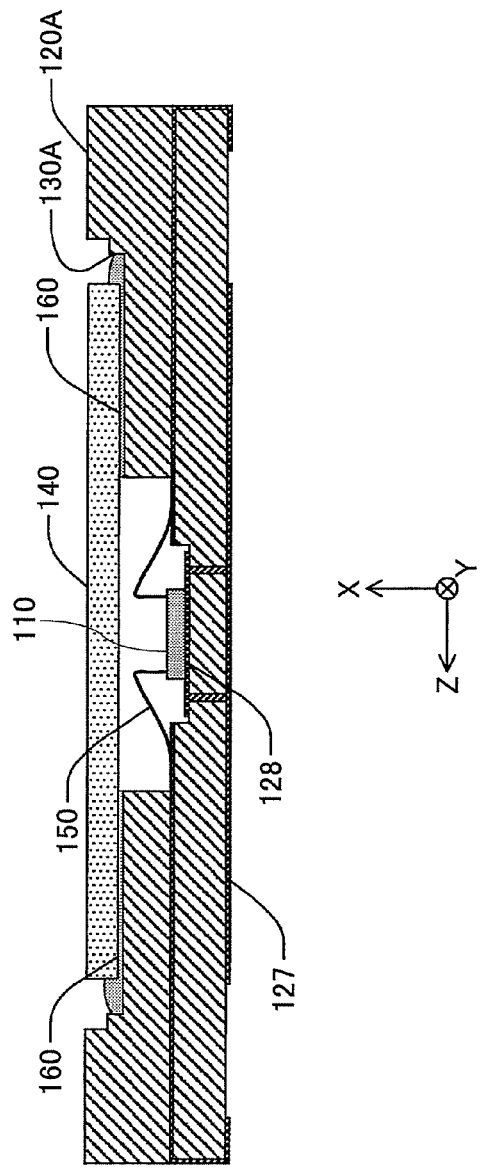
FIG. 16 is a cross-sectional view cut along a line B-B of FIG. 14.

In the present embodiment described above, instead of using the package member 120, a package member 120A may be used. FIGS. 14 through 16 illustrate an example of the package member 120A. The package member 120A has cut-out parts 122 formed at parts of the walls 130A facing the side surfaces of the cover glass 140, as viewed in a perpendicular direction to the bottom surface of the space area 121. In this example, L6 is 0.2 mm. FIG. 15 is a cross-sectional view cut along a line A-A of FIG. 14, and FIG. 16 is a cross-sectional view cut along a line B-B of FIG. 14. In this example, the volume of the gap between the side surfaces of the cover glass 140 and the walls facing the side surfaces of the cover glass 140 is larger than that of the package member 120, and therefore an increased amount of resin can be retained in this example.

Figure 17:
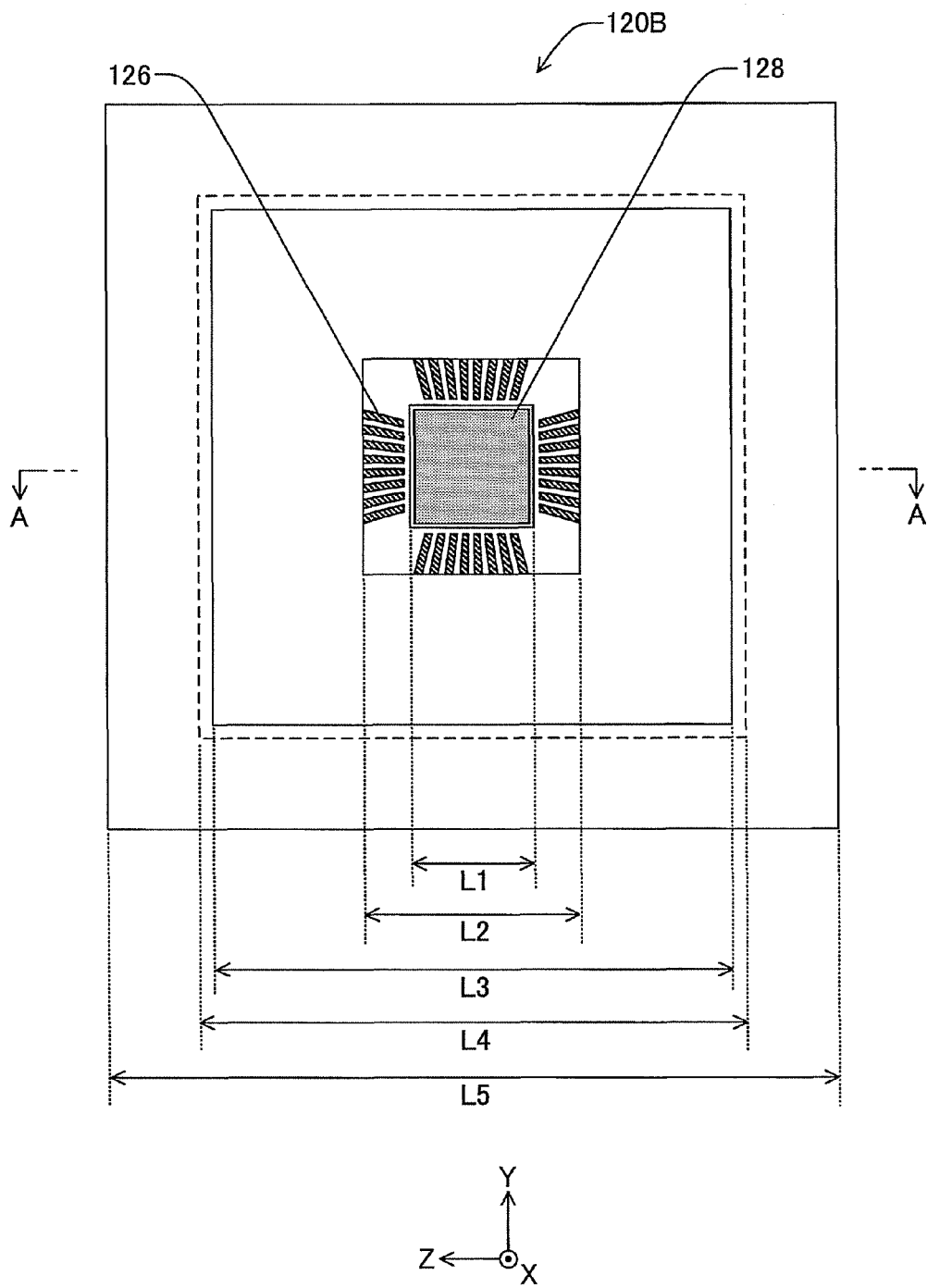
FIG. 17 is for describing a second modification of the package member.
Figure 18:
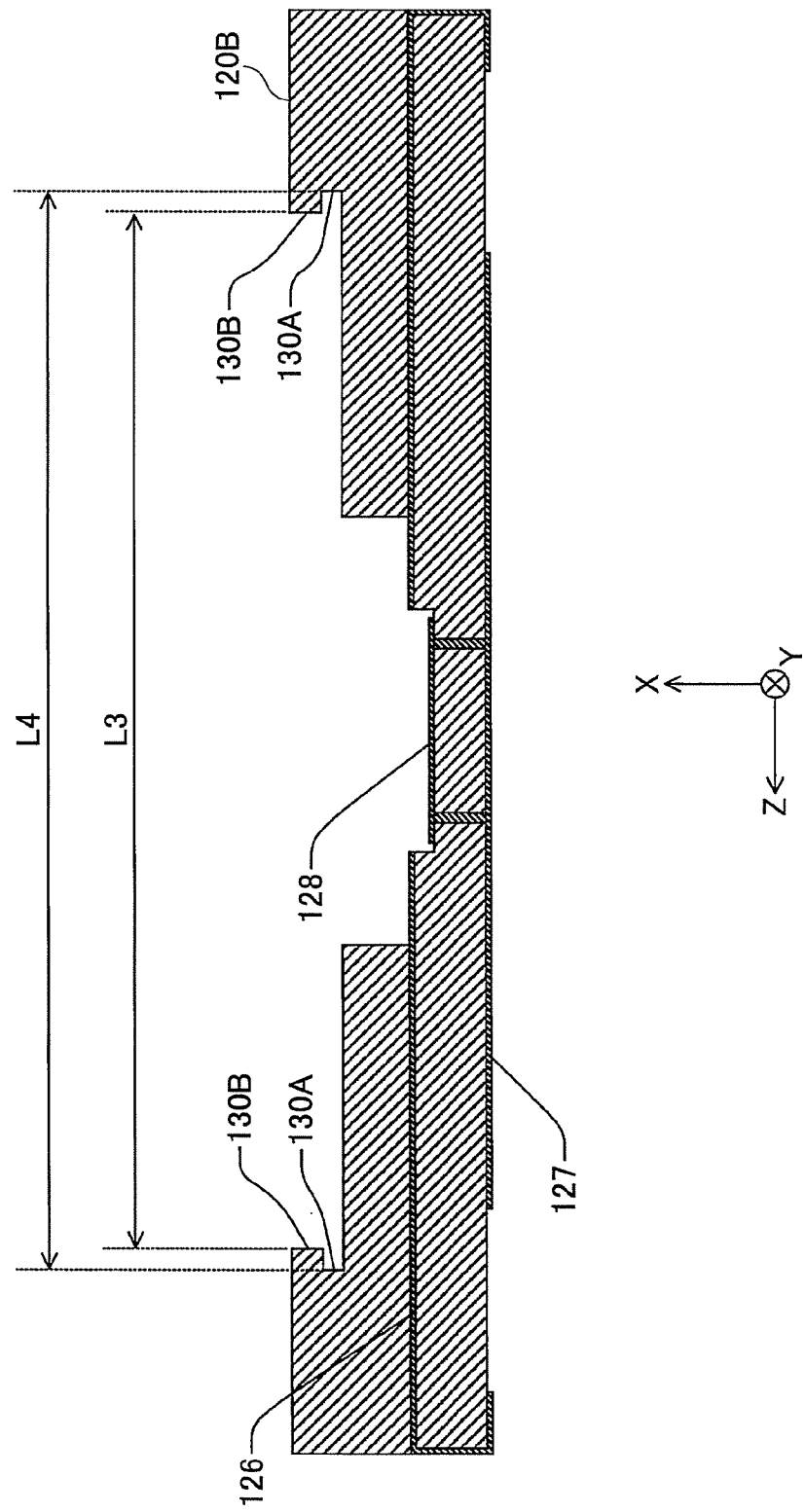
FIG. 18 is a cross-sectional view cut along a line A-A of FIG. 17.
Figure 19:
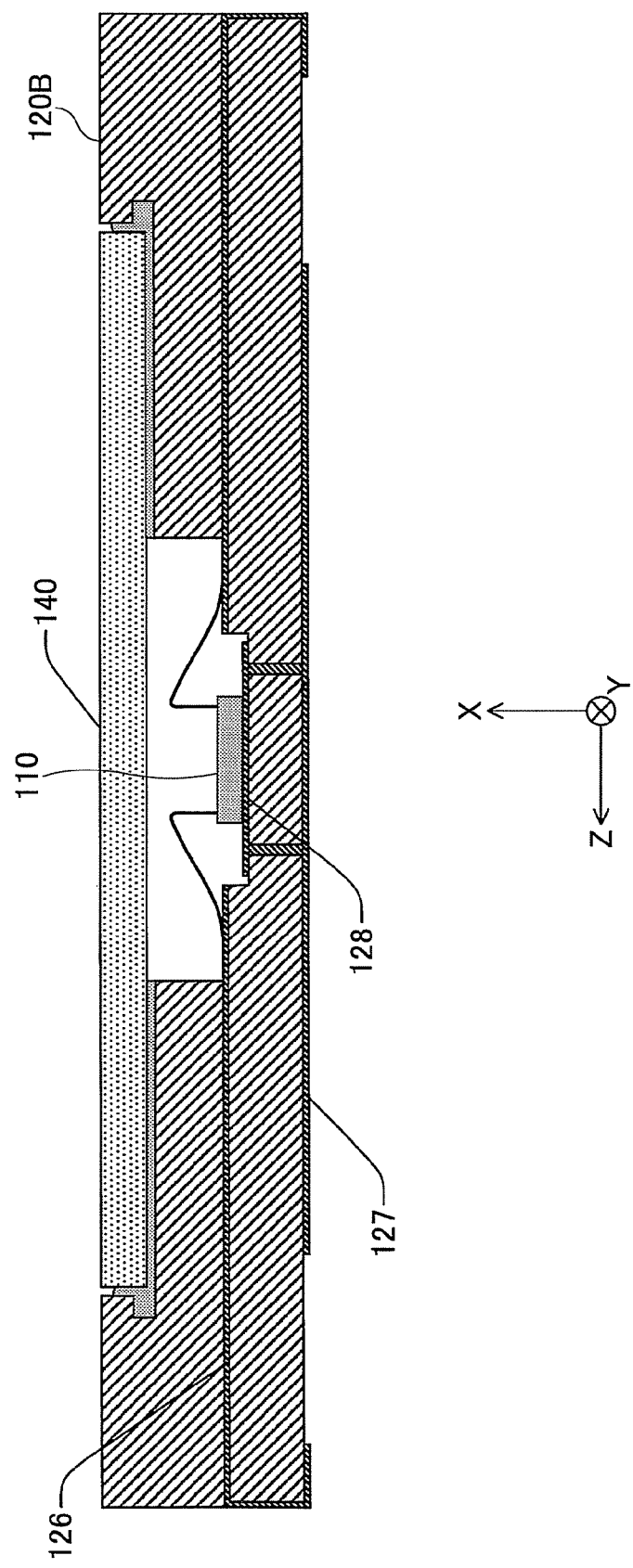
FIG. 19 is for describing a state where a cover glass is attached to the package member of the second modification.
Figure 20:
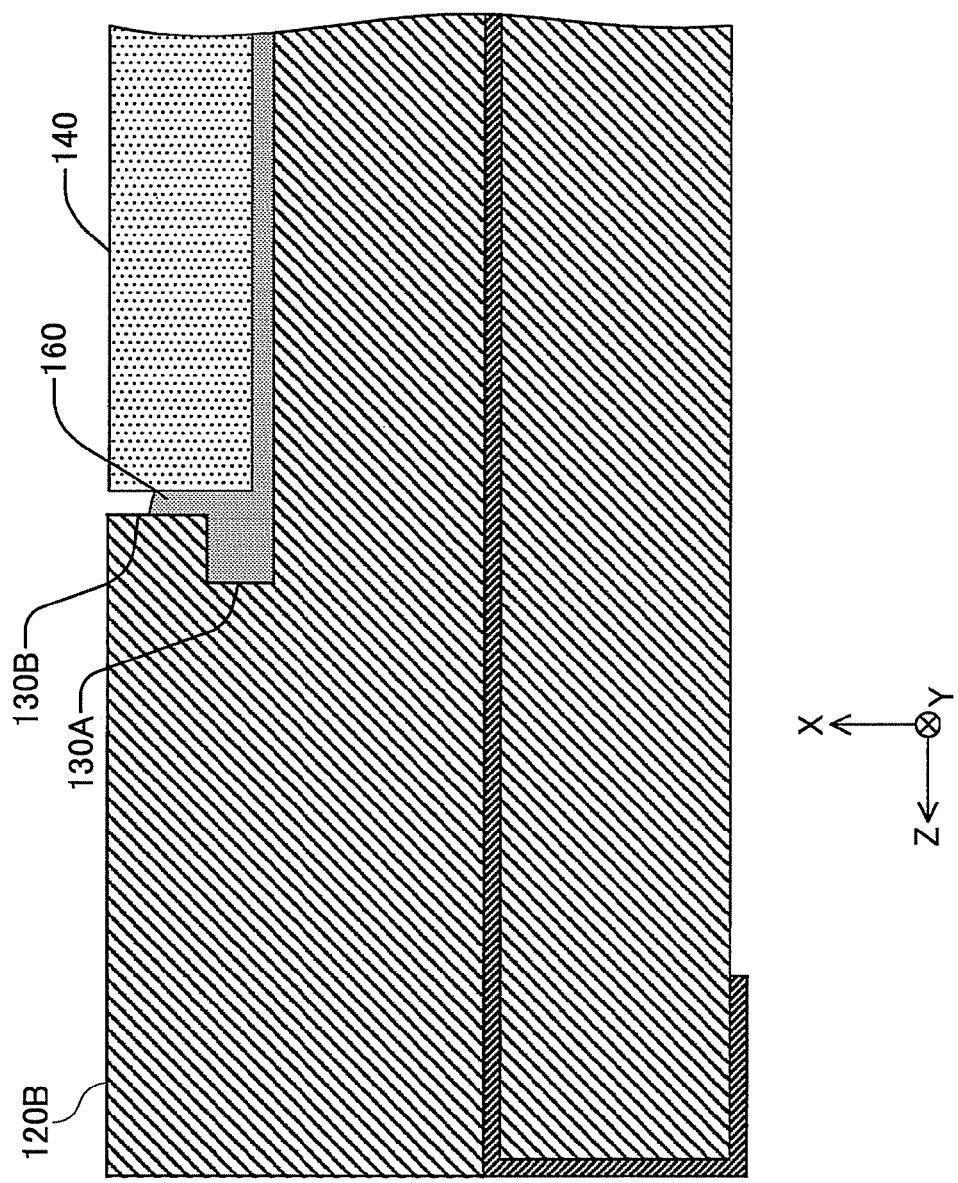
FIG. 20 is a partial enlarged view of FIG. 19.

Furthermore, in the present embodiment described above, instead of using the package member 120, a package member 120B may be used. FIGS. 17 and 18 illustrate an example of the package member 120B. In the package member 120B, the gap between the side walls of the cover glass 140 and the walls 130A is larger than that between the side walls of the cover glass 140 and the walls 130B. FIG. 18 is a cross-sectional view cut along a line A-A of FIG. 17. In this example, as illustrated in FIGS. 19 and 20, the gap between the side walls of the cover glass 140 and the walls 130A is used for retaining excessive resin.

Figure 21:
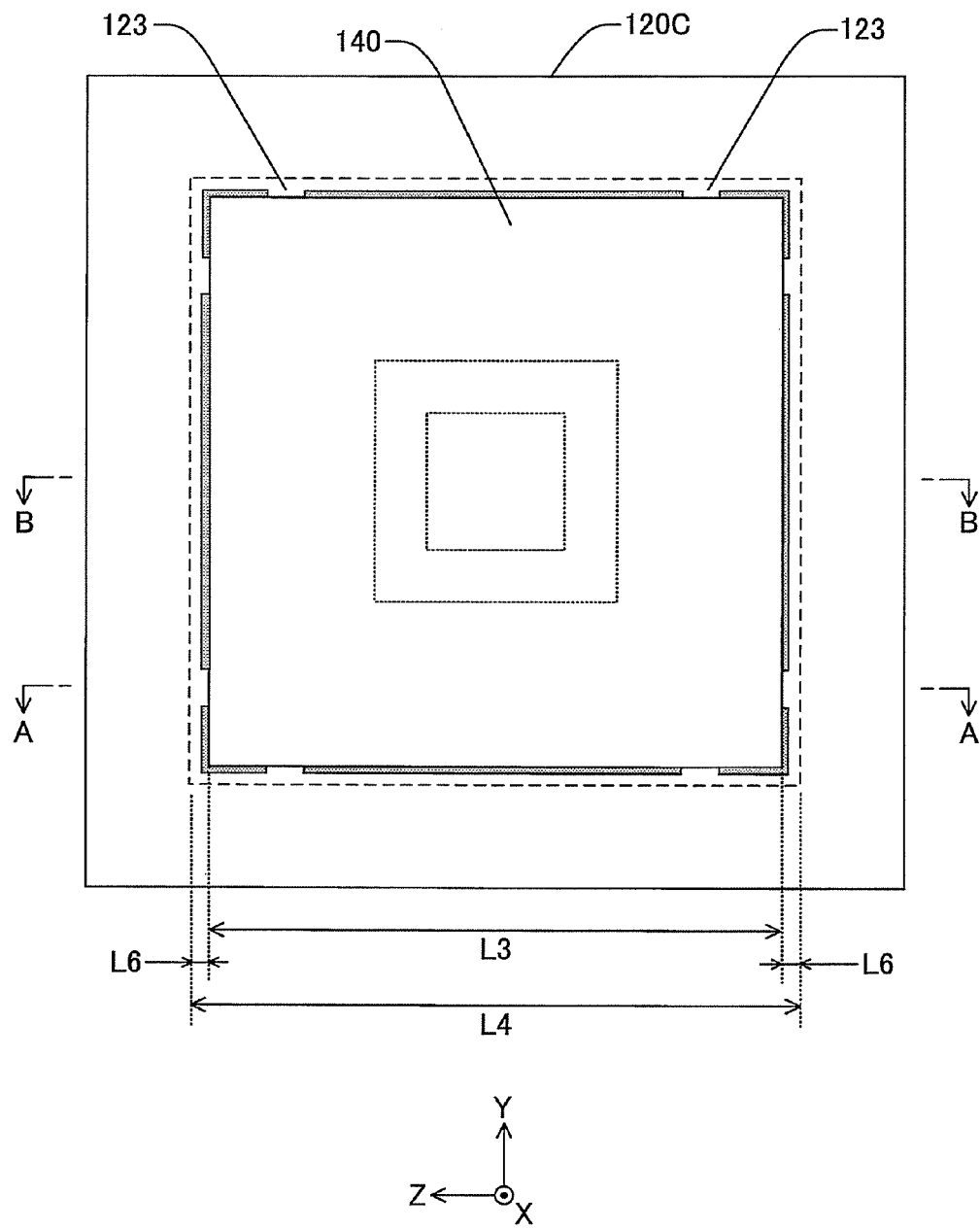
FIG. 21 is for describing a third modification of the package member.
Figure 22:
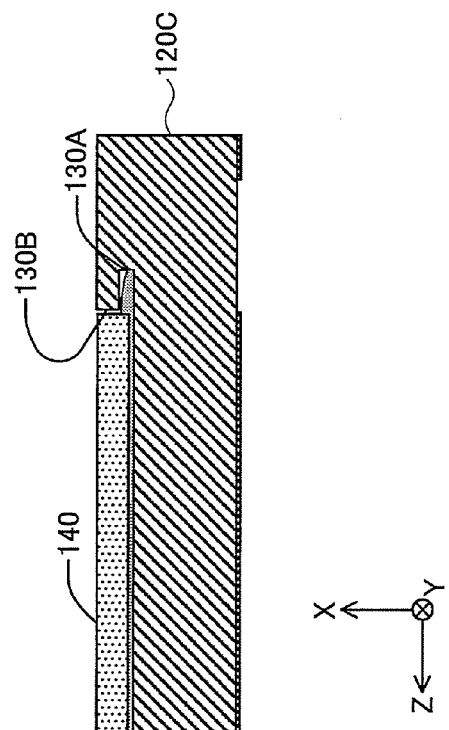
FIG. 22 is a cross-sectional view cut along a line A-A of FIG. 21.
Figure 23:
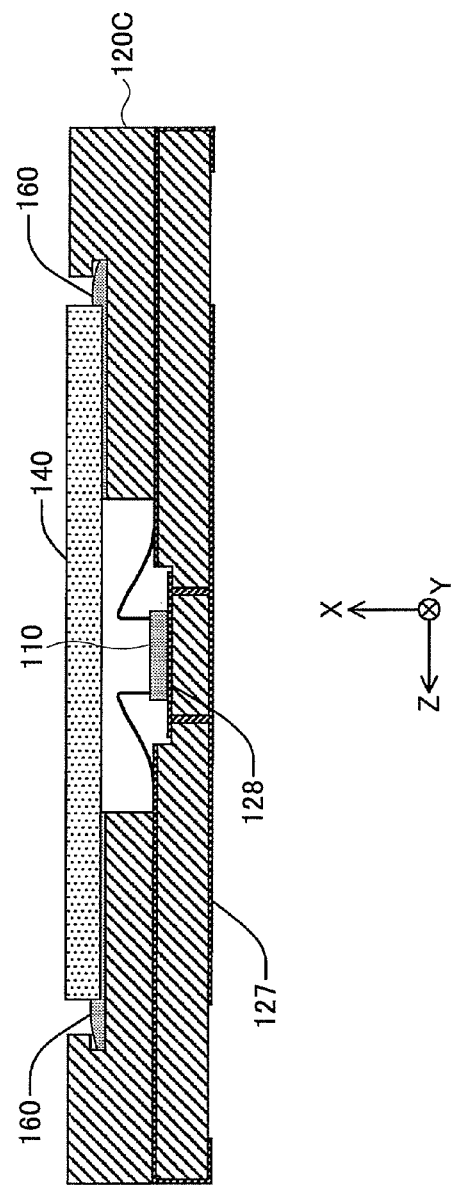
FIG. 23 is a cross-sectional view cut along a line B-B of FIG. 21.

Furthermore, in the present embodiment described above, instead of using the package member 120, a package member 120C may be used. FIGS. 21 through 23 illustrate an example of the package member 120C. The package member 120C has the cutout parts 122 formed at parts of the walls 130B facing the side surfaces of the cover glass 140, as viewed in a perpendicular direction to the bottom surface of the space area 121. FIG. 22 is a cross-sectional view cut along a line A-A of FIG. 21, and FIG. 23 is a cross-sectional view cut along a line B-B of FIG. 21. In this example, the volume of the gap between the side surfaces of the cover glass 140 and the walls facing the side surfaces of the cover glass 140 is larger than that of the package member 120, and therefore an increased amount of resin can be retained in this example.

In the above embodiment, there may be plural protruding parts and receding parts formed on the walls facing the side surfaces of the cover glass 140, in the X axis direction.

In the above embodiment, the laser chip 110 includes 32 light emitting units; however, the present invention is not so limited.

In the above embodiment, each light emitting unit in the laser chip 110 has an oscillation wavelength band of 780 nm; however, the present invention is not so limited. The oscillation wavelength band of each light emitting unit may be modified according to properties of the photoconductor.

In the above embodiment, the optical device 100 has the laser chip 110 in which plural light emitting units are arranged two-dimensionally; however, the present invention is not so limited. For example, instead of the laser chip 110 described above, the optical device 100 may have a laser chip in which plural light emitting units are arranged one-dimensionally.

The respective dimensions described in the above embodiment are merely examples; the present invention is not so limited.

In the above embodiment, the laser printer 1000 is described as an example of the image forming apparatus; however, the present invention is not so limited. That is to say, as long as the image forming apparatus includes the optical scanning device 1010, the image forming apparatus is not limited to the laser printer 1000.

For example, the image forming apparatus may be for forming printing plates, known as CTP (Computer to Plate). In this case, images are directly formed on a printing plate material that is an image carrier, by laser adaptation.

Furthermore, the image forming apparatus may be for directly radiating laser beams onto a medium (for example, a sheet) whose color is inverted in response to receiving laser beams.

For example, the medium may be rewritable paper. Rewritable paper is formed by applying the following materials as a recording layer, on a support body such as a paper sheet or a resin film. By controlling the heat energy of laser beams applied to the rewritable paper, the color of the rewritable paper is inverted, so that images are displayed or erased by the inverting reaction.

Either the transparent/opaque type rewritable marking method or the coloring/decoloring rewritable marking method using leuco dye may be applied.

The transparent/opaque type rewritable marking method is performed as follows. Fatty acid particles are dispersed in a high polymer thin film. When this material is heated at a temperature of 110° C. or more, the fatty acid melts and the resin expands. Subsequently, when the material is cooled, the fatty acid supercools and remains as liquid, while the expanded resin solidifies. The fatty acid solidifies and contracts and becomes polycrystalline particles, such that gaps are formed between the resin and the particles. Light is scattered due to these gaps, so that the corresponding portions appear to be white. Next, when the material is heated with a decoloring temperature ranging from 80° C. through 110° C., some of the fatty acid melts and the resin thermally-expands, such that the gaps are filled. When the material is cooled in this state, the corresponding portions become transparent, such that the image is erased.

The coloring/decoloring rewritable marking method using leuco dye is performed by the coloring/decoloring mechanism according to the inverting reaction between colorless leuco dye and a color developing/erasing agent having a long-chain alkyl group. When heat is applied by laser beams, the leuco dye and the color developing/erasing agent react to the heat and generate color. Then, when these materials are rapidly cooled, the color is maintained. Subsequently, when the materials are heated, and then slowly cooled, phase separation occurs due to autoagglutination of the long-chain alkyl group of the color developing/erasing agent. Therefore, the leuco dye and the color developing/erasing agent are physically separated, and the color disappears.

Furthermore, the medium may be color rewritable paper formed by applying the following materials on a support body such as a paper sheet or a resin film. One type of the materials is a photo-chromic compound that generates a cyan (C) color in response to receiving ultraviolet rays, and erases the cyan color in response to receiving red visible light. Another type of the materials is a photo-chromic compound that generates a magenta (M) color in response to receiving ultraviolet rays, and erases the magenta color in response to receiving green visible light. Yet another type of the materials is a photo-chromic compound that generates a yellow (Y) color in response to receiving ultraviolet rays, and erases the yellow color in response to receiving blue visible light.

With this paper, it is possible to express full color as follows. First, a completely black color is temporarily attained by radiating ultraviolet rays. Then, the color densities of the three types of materials that generate Y, M, and C colors are controlled by adjusting the time and intensity of radiating the R, G, and B light beams, to express full-color. For example, it is possible to attain a completely white color by radiating intense R, G, and B light beams to erase all three colors.

An image forming apparatus that controls light energy to invert colors may also be applied as the image forming apparatus including the optical scanning device according to the present embodiment.

Furthermore, the image forming apparatus including the optical scanning device according to the present embodiment may use a silver salt film as the image carrier. In this case, a latent image is formed on the silver salt film by optical scanning, and this latent image may be turned into a visible image by the same developing process as that performed for developing a typical silver salt photograph. Furthermore, the same photofinishing process as that performed for a typical silver salt photograph may be performed to transfer the visible image onto a print sheet. This kind of image forming apparatus may be implemented as an optical plate making device or an optical drawing device for drawing CT scan images.

Figure 24:
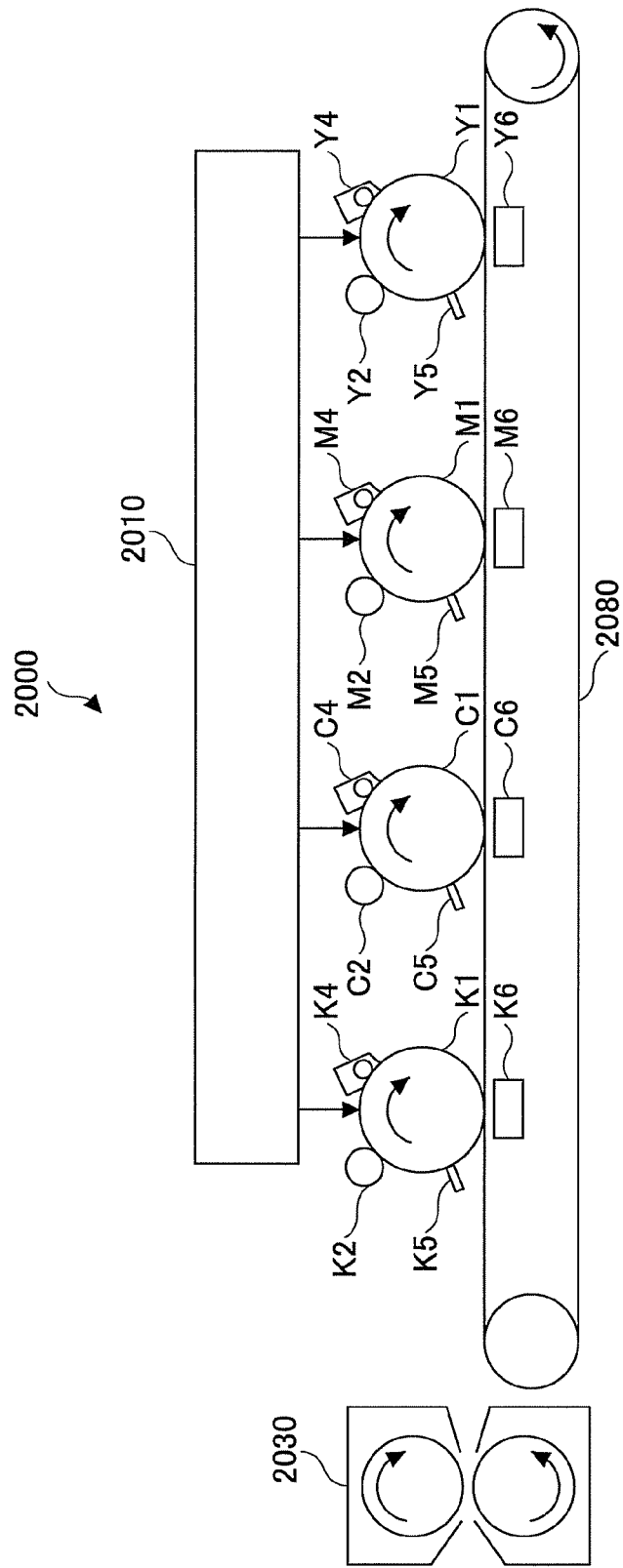
FIG. 24 is a schematic diagram of a color printer.

Furthermore, the image forming apparatus including the optical scanning device according to the present embodiment may be a color printer 2000 including plural photoconductive drums, as illustrated in FIG. 24.

The color printer 2000 is a tandem type multicolor printer that forms a full color image by superposing four monochrome images of respective colors (black, cyan, magenta, and yellow). The color printer 2000 includes a station for black (a photoconductive drum K1, a charging device K2, a developing device K4, a cleaning unit K5, and a transfer device K6), a station for cyan (a photoconductive drum C1, a charging device C2, a developing device C4, a cleaning unit C5, and a transfer device C6), a station for magenta (a photoconductive drum M1, a charging device M2, a developing device M4, a cleaning unit M5, and a transfer device M6), a station for yellow (a photoconductive drum Y1, a charging device Y2, a developing device Y4, a cleaning unit Y5, and a transfer device Y6), an optical scanning device 2010, a transfer belt 2080, and a fixing unit 2030.

The photoconductive drums rotate in directions indicated by arrows in FIG. 24. Around each photoconductive drum, the charging device, the developing device, the transfer device, and the cleaning unit are arranged along the rotation direction of the photoconductive drum.

The charging devices uniformly charge the surfaces of the corresponding photoconductive drums. The optical scanning device 2010 optically scans the surfaces of the photoconductive drums that have been charged by the corresponding charging devices, so that latent images are formed on the photoconductive drums.

Then, the developing devices form toner images on the surfaces of the corresponding photoconductive drums. Then, the transferring devices sequentially transfer the corresponding toner images onto a recording sheet on the transfer belt 2080. Finally, the fixing unit 2030 fixes the images onto the recording sheet.

The optical scanning device 2010 includes light sources that are the same as the light source 14, corresponding to the respective colors. Therefore, the same effects as those of the optical scanning device 1010 can be achieved.

In a tandem type multicolor printer, color shift may occur depending on the machine accuracy. However, by selecting the light emitting units to be lit, the precision in correcting color shift of the respective colors may be enhanced.

In the color printer 2000, one optical scanning device may be provided for each color, or for two colors.

In the present embodiment, the optical scanning device 1010 is included in a printer. However, the optical scanning device 1010 is also appropriately applicable to an image forming apparatus other than a printer, such as a copier, a fax machine, or a multifunction peripheral in which functions of a copier and a fax machine are integrated.

In the present embodiment, the optical device 100 is used in the optical scanning device; however, the present invention is not so limited. In other examples, each light emitting unit of the laser chip 110 may have an oscillation wavelength band of, for example, 650 nm, 850 nm, 980 nm, 1.3 µm, and 1.5 µm, depending on the purpose.

Furthermore, an embodiment of the present invention is also applicable to an optical device including, for example, light receiving elements such as a CCD sensor and a CMOS sensor, and optical elements such as an optical scanner element using an MEMS mirror and an optical switching element.

As described above, an optical device according to an embodiment of the present invention is appropriate for increasing productivity without decreasing the resistance to high temperature and high humidity. An optical scanning device according to an embodiment of the present invention is appropriate for performing optical scanning in a stable manner. An image forming apparatus according to an embodiment of the present invention is appropriate for forming high quality images.

According to an aspect of the present invention, productivity can be increased without decreasing the resistance to high temperature and high humidity.

According to an aspect of the present invention, optical scanning can be performed in a stable manner.

According to an aspect of the present invention, high quality images can be formed.

According to an aspect of the present invention, the optical device according to an embodiment of the present invention can be appropriately manufactured.

The present invention is not limited to the specific embodiments described herein, and variations and modifications may be made without departing from the scope of the present invention.

The present application is based on Japanese Priority Patent Application No. 2009-258536, filed on Nov. 12, 2009, and Japanese Priority Patent Application No. 2010-168978, filed on Jul. 28, 2010, the entire contents of which are hereby incorporated herein by reference.

What is claimed is:

1. An optical device comprising:
   an optical element;
   a package member in which the optical element is held on a bottom surface of the package member in an area surrounded by walls; and
   a plate member that seals the area surrounded by the walls and the bottom surface in an airtight manner, the plate member being translucent and joined to the package member with a resin material, wherein
   the walls have a structure including steps,
   the plate member is joined onto one of the steps of the walls, and
   at least a part of the walls facing side surfaces of the plate member includes a positioning part for positioning the plate member and a retaining part for retaining the resin material, in a direction perpendicular to the bottom surface, and wherein
   the positioning part includes one or more cutout parts configured to retain the resin material, as viewed in the direction perpendicular to the bottom surface.

2. The optical device according to claim 1, wherein the positioning part is closer to the one of the steps than the retaining part.

3. The optical device according to claim 1, wherein the retaining part is closer to the one of the steps than the positioning part.

4. The optical device according to claim 1, wherein at least a part of the walls facing the side surfaces of the plate member includes a protruding part and a receding part in a vertical sectional view of the package member.

5. The optical device according to claim 1, wherein the package member is made of ceramics.

6. The optical device according to claim 1, wherein the optical element is a surface-emitting laser array, in which a plurality of light emitting units are formed on a single substrate.

7. An optical scanning device for scanning a scanning target surface with light, the optical scanning device comprising:
- a light source including the optical device according to claim 6;
- a deflector that deflects the light from the light source; and
- a scanning optical system that focuses, on the scanning target surface, the light that has been deflected by the deflector.

8. An image forming apparatus comprising:
- at least one image carrier; and
- at least one of the optical scanning devices according to claim 7 that scans the at least one image carrier with the light including image information.

9. The image forming apparatus according to claim 8, wherein the image information is multicolor image information.

10. The optical device according to claim 1, wherein the optical element is a surface-emitting laser element.

\* \* \* \* \*